United States Patent
Wang et al.

(10) Patent No.: US 12,190,781 B2
(45) Date of Patent: Jan. 7, 2025

(54) SHIFT REGISTER UNIT AND DRIVING METHOD THEREFOR, GATE DRIVE CIRCUIT, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zhu Wang, Beijing (CN); Zhenglong Yan, Beijing (CN); Hui Lu, Beijing (CN); Ke Liu, Beijing (CN); Ling Shi, Beijing (CN); Yipeng Chen, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/910,539

(22) PCT Filed: Oct. 25, 2021

(86) PCT No.: PCT/CN2021/126087
§ 371 (c)(1),
(2) Date: Sep. 9, 2022

(87) PCT Pub. No.: WO2022/213579
PCT Pub. Date: Oct. 13, 2022

(65) Prior Publication Data
US 2024/0203316 A1  Jun. 20, 2024

(30) Foreign Application Priority Data
Apr. 8, 2021 (CN) .......................... 202110378872.1

(51) Int. Cl.
*G09G 3/20* (2006.01)
*G11C 19/28* (2006.01)

(52) U.S. Cl.
CPC ... *G09G 3/2092* (2013.01); *G09G 2310/0286* (2013.01); *G09G 2310/08* (2013.01); *G11C 19/28* (2013.01)

(58) Field of Classification Search
CPC ......... G09G 3/2092; G09G 2310/0286; G09G 2310/08; G09G 3/20; G09G 3/3266; G09G 3/3677; G11C 19/28
See application file for complete search history.

(56) References Cited

U.S. PATENT DOCUMENTS

| 2017/0357352 A1 | 12/2017 | Yang et al. |
| 2018/0144677 A1 | 5/2018 | Zhang et al. |

FOREIGN PATENT DOCUMENTS

| CN | 106057117 A | * 10/2016 | ............... G09G 3/20 |
| CN | 106128378 A | 11/2016 | |

(Continued)

OTHER PUBLICATIONS

CN202110378872.1 first office action.
CN202110378872.1 second office action.
CN202110378872.1 Decision of rejection.

*Primary Examiner* — Brent D Castiaux
(74) *Attorney, Agent, or Firm* — IPro, PLLC

(57) ABSTRACT

Provided is a shift register unit. The shift register unit includes a first input circuit, a second input circuit and an output circuit. The first input circuit is coupled to a first clock terminal, a first node, a second node, a third node, a pull-up power supply terminal, and a pull-down power supply terminal. The second circuit is coupled to the first node, the second node, the third node, the pull-up power supply terminal, the pull-down power supply terminal, an input control terminal, and the first clock terminal. The (Continued)

output circuit is coupled to the pull-up power supply terminal, the pull-down power supply terminal, the third node, a second clock terminal, and an output terminal.

14 Claims, 9 Drawing Sheets

(56) References Cited

FOREIGN PATENT DOCUMENTS

| | | |
|---|---|---|
| CN | 107705748 A | 2/2018 |
| CN | 111243482 A | 6/2020 |
| CN | 113113069 A | 7/2021 |

* cited by examiner

SHIFT REGISTER UNIT AND DRIVING METHOD THEREFOR, GATE DRIVE CIRCUIT, AND DISPLAY DEVICE

CROSS-REFERENCE TO RELATED APPLICATION

The present disclosure is a U.S. national stage of international application No. PCT/CN2021/126087, filed on Oct. 25, 2021, which claims priority to Chinese Patent Application No. 202110378872.1, filed on Apr. 8, 2021, and entitled "SHIFT REGISTER UNIT AND DRIVING METHOD THEREFOR, GATE DRIVE CIRCUIT, AND DISPLAY DEVICE", the disclosures of which are incorporated herein by reference in their entireties.

TECHNICAL FIELD

The present disclosure relates to the field of display technologies, and in particular, relates to a shift register unit and a driving method therefore, a gate drive circuit, and a display device.

BACKGROUND

A shift register generally includes a plurality of cascaded shift register units. Each shift register unit is configured to drive one row of pixel units. The plurality of cascaded shift register units can drive pixel units in a display device row by row to display an image.

SUMMARY

Embodiments of the present disclosure provide a shift register unit and a driving method therefore, a gate drive circuit, and a display device. The technical solutions are as follows.

According to some embodiments, a shift register unit is provided. The shift register unit includes:
  a first input circuit coupled to a first clock terminal, a first node, a second node, a third node, a pull-up power supply terminal, and a pull-down power supply terminal, wherein first input circuit is configured to control the pull-up power supply terminal to be conducted or non-conducted with the first node and control the pull-down power supply terminal to be conducted or non-conducted with the first node in response to a first clock signal provided by the first clock terminal: and control the pull-up power supply terminal to be conducted or non-conducted with the third node and control the pull-down power supply terminal to be conducted or non-conducted with the third node in response to a potential of the second node;
  a second input circuit coupled to the first node, the second node, the third node, the pull-up power supply terminal, the pull-down power supply terminal, an input control terminal, and the first clock terminal, wherein second input circuit is configured to control the pull-up power supply terminal to be conducted or non-conducted with the second node and control the pull-down power supply terminal to be conducted or non-conducted with the second node in response to a potential of the first node, a potential of the third node, the first clock signal, and an input control signal provided by the input control terminal: and
  an output circuit coupled to the pull-up power supply terminal, the pull-down power supply terminal, the third node, a second clock terminal, and an output terminal, wherein output circuit is configured to control the pull-up power supply terminal to be conducted or non-conducted with the output terminal and control the pull-down power supply terminal to be conducted or non-conducted with the output terminal in response to the potential of the third node and a second clock signal provided by the second clock terminal.

Optionally, the output circuit includes a first output sub-circuit and a second output sub-circuit; wherein
  the first output sub-circuit is coupled to the second clock terminal, the third node, the pull-up power supply terminal, the pull-down power supply terminal, and a fourth node, and is configured to control the pull-up power supply terminal to be conducted or non-conducted with the fourth node and control the pull-down power supply terminal to be conducted or non-conducted with the fourth node in response to the second clock signal and the potential of the third node: and
  the second output sub-circuit is coupled to the fourth node, the pull-up power supply terminal, the pull-down power supply terminal, and the output terminal, and is configured to control the pull-up power supply terminal to be conducted or non-conducted with the output terminal and control the pull-down power supply terminal to be conducted or non-conducted with the output terminal in response to a potential of the fourth node.

Optionally, the first output sub-circuit includes a first output transistor, a second output transistor, and a third output transistor, the first output transistor being a complementary metal-oxide-semiconductor (CMOS) transistor; wherein
  a gate of the first output transistor is coupled to the second clock terminal, one first electrode of the first output transistor and a first electrode of the second output transistor are both coupled to the pull-up power supply terminal, the other first electrode of the first output transistor is coupled to a second electrode of the third output transistor, a second electrode of the first output transistor and a second electrode of the second output transistor are both coupled to the fourth node, a gate of the second output transistor and a gate of the third output transistor are both coupled to the third node, and a first electrode of the third output transistor is coupled to the pull-down power supply terminal.

Optionally, the second output sub-circuit includes an odd number of fourth output transistors connected in series between the fourth node and the output terminal; wherein
  each of the fourth output transistors is a CMOS transistor, and two first electrodes of each of the fourth output transistors are coupled to the pull-up power supply terminal and the pull-down power supply terminal, respectively.

Optionally, the second output sub-circuit includes three fourth output transistors; wherein
  a gate of a first one of the fourth output transistors is coupled to the fourth node, and a second electrode of the first one of the fourth output transistors is coupled to a gate of a second one of the fourth output transistors: a second electrode of the second one of the fourth output transistors is coupled to a gate of a third one of the fourth output transistors, and a second electrode of the third one of the fourth output transistors is coupled to the output terminal.

Optionally, a width-to-length ratio of at least one of the fourth output transistors is greater than width-to-length ratios of transistors in the shift register unit except the at least one of the fourth output transistors.

Optionally, the second input circuit includes a first input sub-circuit and a second input sub-circuit; wherein the first input sub-circuit is coupled to the first node, the first clock terminal, the input control terminal, the pull-up power supply terminal, the pull-down power supply terminal, and the second node, and is configured to control the pull-up power supply terminal to be conducted or non-conducted with the second node and control the pull-down power supply terminal to be conducted or non-conducted with the second node in response to the potential of the first node, the input control signal, and the first clock signal: and the second input sub-circuit is coupled to the first clock terminal, the first node, the second node, the third node, the pull-up power supply terminal, and the pull-down power supply terminal, and is configured to control the pull-up power supply terminal to be conducted or non-conducted with the second node and control the pull-down power supply terminal to be conducted or non-conducted with the second node in response to the potential of the first node, the potential of the third node, and the first clock signal.

Optionally, the first input sub-circuit includes a first input transistor, a second input transistor, a third input transistor, and a fourth input transistor: the first input transistor and the third input transistor being CMOS transistors; wherein a gate of the first input transistor is coupled to the first node, two first electrodes of the first input transistor are coupled to the pull-up power supply terminal and the pull-down power supply terminal respectively, and a second electrode of the first input transistor is coupled to a gate of the second input transistor, and the gate of the second input transistor is further coupled to the first clock terminal;

a first electrode of the second input transistor is coupled to the pull-down power supply terminal and a second electrode of the second input transistor is coupled to one first electrode of the third input transistor;

the other first electrode of the third input transistor is coupled to a second electrode of the fourth input transistor, a gate of the third input transistor is coupled to the input control terminal, and a second electrode of the third input transistor is coupled to the second node: and a gate of the fourth input transistor is coupled to the first node and a first electrode of the fourth input transistor is coupled to the pull-up power supply terminal.

Optionally, the second input sub-circuit includes a fifth input transistor, a sixth input transistor, and a seventh input transistor: the sixth input transistor being a CMOS transistor; wherein a gate of the fifth input transistor is coupled to the first clock terminal, a first electrode of the fifth input transistor is coupled to the pull-up power supply terminal, and a second electrode of the fifth input transistor is coupled to one first electrode of the sixth input transistor;

the other first electrode of the sixth input transistor is coupled to a second electrode of the seventh input transistor and a gate of the sixth input transistor is coupled to the third node: and a first electrode of the seventh input transistor is coupled to the pull-down power supply terminal and a gate of the seventh input transistor is coupled to the first node.

Optionally, the first input circuit includes a third input sub-circuit and a fourth input sub-circuit; wherein the third input sub-circuit is coupled to the first clock terminal, the pull-up power supply terminal, the pull-down power supply terminal, and the first node, and is configured to control the pull-up power supply terminal to be conducted or non-conducted with the first node and control the pull-down power supply terminal to be conducted or non-conducted with the first node in response to the first clock signal: and the fourth input sub-circuit is coupled to the second node, the pull-up power supply terminal, the pull-down power supply terminal, and the third node, and is configured to control the pull-up power supply terminal to be conducted or non-conducted with the third node and control the pull-down power supply terminal to be conducted or non-conducted with the third node in response to the potential of the second node.

Optionally, the third input sub-circuit includes an eighth input transistor and a ninth input transistor: and the fourth input sub-circuit includes a tenth input transistor: the eighth input transistor, the ninth input transistor, and the tenth input transistor being CMOS transistors; wherein a gate of the eighth input transistor and a gate of the ninth input transistor are both coupled to the first clock terminal, two first electrodes of the eighth input transistor are coupled to the pull-up power supply terminal and the pull-down power supply terminal respectively, and two first electrodes of the ninth input transistor are also coupled to the pull-up power supply terminal respectively: and a second electrode of the eighth input transistor and a second electrode of the ninth input transistor are both coupled to the first node; and a gate of the tenth input transistor is coupled to the second node, two first electrodes of the tenth input transistor are coupled to the pull-up power supply terminal and the pull-down power supply terminal respectively, and a second electrode of the tenth input transistor is coupled to the third node.

According to some embodiments, a method for driving a shift register unit is provided. The method is applicable to driving the shift register unit as described above. The method includes:

in an input phase, controlling, by a first input circuit, a pull-down power supply terminal to be conducted with a first node in response to a first clock signal provided by a first clock terminal: controlling, by a second input circuit, the pull-down power supply terminal to be conducted with a second node in response to an input control signal provided by an input control terminal and the first clock signal: and controlling further, by the first input circuit, a pull-up power supply terminal to be conducted with a third node in response to a potential of the second node;

in an output phase, controlling, by the first input circuit, the pull-up power supply terminal to be conducted with the first node in response to the first clock signal: controlling, by the second input circuit, the pull-down power supply terminal to be conducted with the second node in response to a potential of the first node and a potential of the third node: controlling further, by the first input circuit, the pull-up power supply terminal to be conducted with the third node in response to the potential of the second node: and controlling, by an output circuit, the pull-up power supply terminal to be conducted with an output terminal in response to the potential of the third node and a second clock signal provided by a second clock terminal: and in a pull-down phase, controlling, by the first input circuit, the pull-down power supply terminal to be conducted with the first node in response to the first clock signal: controlling, by the second input circuit, the pull-up power supply terminal to be conducted with the second node in response to the potential of the first node and the input control signal: controlling further, by the first input circuit, the pull-down power supply terminal to be conducted with the third node in response to the potential of the second node: and controlling, by the output circuit, the pull-down power supply terminal to be conducted with the output terminal in response to the potential of the third node and the second clock signal.

According to some embodiments, a gate drive circuit is provided. The gate drive circuit includes at least two cascaded shift register units as described above.

A first clock terminal of the shift register unit at an odd-numbered stage is coupled to a first clock signal line and a second clock terminal of the shift register unit at the odd-numbered stage is coupled to a second clock signal line: and a first clock terminal of the shift register unit at an even-numbered stage is coupled to the second clock signal line and a second clock terminal of the shift register unit at the even-numbered stage is coupled to the first clock signal line.

According to some embodiments, a display device is provided. The display device includes a display panel and the gate drive circuit as described above. The display panel includes a plurality of pixel circuits: and the gate drive circuit is coupled to gate signal terminals in the pixel circuits, and is configured to provide gate drive signals to the gate signal terminals.

Optionally, the pixel circuit includes a first switching transistor, a second switching transistor, a third switching transistor, a fourth switching transistor, a fifth switching transistor, a sixth switching transistor, a seventh switching transistor, and a storage capacitor; wherein a gate of the first switching transistor is coupled to a reset control terminal, a first electrode of the first switching transistor is coupled to a reset signal terminal, and a second electrode of the first switching transistor is coupled to a first electrode of the second switching transistor, a second electrode of the sixth switching transistor, and an anode of a light-emitting element;

a gate of the second switching transistor is coupled to a switch control terminal and a second electrode of the second switching transistor is coupled to a gate of the third switching transistor;

a gate of the fifth switching transistor and a gate of the sixth switching transistor are both coupled to a light-emitting control terminal, a first electrode of the fifth switching transistor is coupled to a drive power supply terminal, and a second electrode of the fifth switching transistor is coupled to a first electrode of the third switching transistor; and a first electrode of the sixth switching transistor is coupled to a second electrode of the third switching transistor;

a gate of the fourth switching transistor and a gate of the seventh switching transistor are both coupled to the gate signal terminal, a first electrode of the fourth switching transistor is coupled to a data signal terminal, and a second electrode of the fourth switching transistor is coupled to the second electrode of the third switching transistor; and a first electrode of the seventh switching transistor is coupled to the first electrode of the third switching transistor, and a second electrode of the seventh switching transistor is coupled to the gate of the third switching transistor; and one terminal of the storage capacitor is coupled to the gate of the third switching transistor and the other terminal of the storage capacitor is coupled to the drive power supply terminal;

wherein the fourth switching transistor and the seventh switching transistor are N-type indium-gallium-zinc-oxide (IGZO) transistors, and an output terminal of a shift register unit in the gate drive circuit is coupled to the gate of the fourth switching transistor and the gate of the seventh switching transistor.

BRIEF DESCRIPTION OF THE DRAWINGS

For clearer descriptions of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

DETAILED DESCRIPTION

To make the objectives, technical solutions, and advantages of the present disclosure clearer, the present disclosure will be further described in detail below with reference to the accompanying drawings.

Transistors in all embodiments of the present disclosure are thin film transistors, field effect transistors, or other devices having the same characteristics. The transistors in the embodiments of the present disclosure are mainly switching transistors based on their functions in circuits. Because a source and drain of the switching transistor are symmetrical, the source and drain are interchangeable. In the embodiments of the present disclosure, the source is referred to as a first electrode and the drain is referred to as a second electrode, or the drain is referred to as the first electrode and the source is referred to as the second electrode. According to the form in the accompanying drawings, a middle terminal of the transistor is a gate, a signal input terminal is the source, and a signal output terminal is the drain. In addition, the switching transistor in the embodiments of the present disclosure is a P-type switching transistor or an N-type switching transistor. The P-type switching transistor is turned on when the gate is at a low level and turned off when the gate is at a high level. The N-type switching transistor is turned on when the gate is at the high level and turned off when the gate is at the low level. In addition, a plurality of signals in the embodiments of the present disclosure each have a first potential and a second potential. The first potential and the second potential only represent that the potential of the signal has two different state variables, but do not represent that the first potential or the second potential in the whole text has a specific value.

As known to the inventors, the shift register unit generally includes an input circuit, an output circuit, and a pull-down circuit. The input circuit is coupled to a pull-up node, and is configured to charge the pull-up node based on a drive signal output by a shift register unit at a previous stage. The output circuit is coupled to an output terminal, and is configured to output a gate drive signal to the output terminal under control of the pull-up node. The pull-down circuit is coupled to the pull-up node and the output terminal, and is configured to pull down and reduce noise for the pull-up node and the output terminal. However, the process known to the inventors of controlling a potential of the output terminal by the shift register unit is complex, and the control flexibility is poor.

Figure 1:
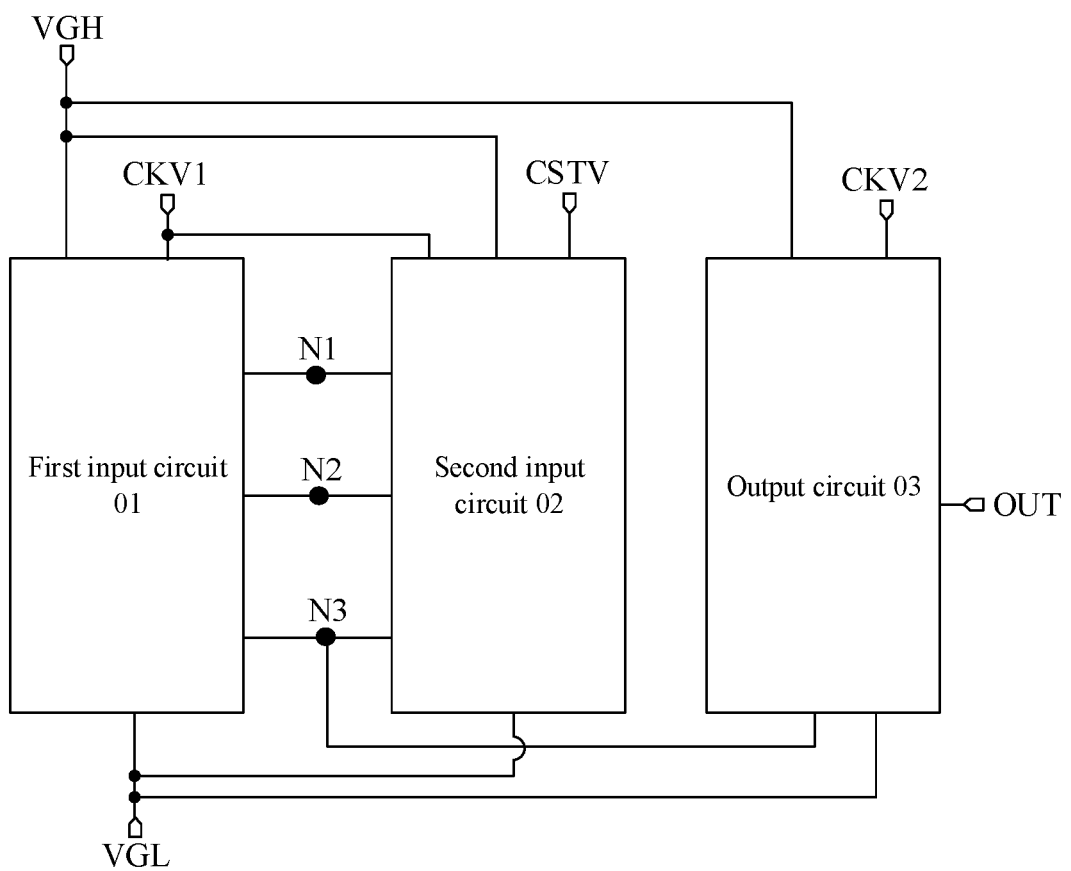
FIG. 1 is a schematic structural diagram of a shift register unit according to some embodiments of the present disclosure.

The embodiments of the present disclosure provide a shift register unit. The process of controlling the potential of an output terminal by the shift register unit is simple, and the control flexibility is good. FIG. 1 is a schematic structural diagram of a shift register unit according to some embodiments of the present disclosure. As shown in FIG. 1, the shift register unit includes a first input circuit 01, a second input circuit 02, and an output circuit 03.

Referring to FIG. 1, the first input circuit 01 is be coupled to a first clock terminal CKV1, a first node N1, a second node N2, a third node N3, a pull-up power supply terminal VGH, and a pull-down power supply terminal VGL. The first input circuit 01 is configured to control the pull-up power supply terminal VGH to be conducted or non-conducted with the first node N1 and control the pull-down power supply terminal VGL to be conducted or non-conducted with the first node N1 in response to a first clock signal provided by the first clock terminal CKV1; and control the pull-up power supply terminal VGH to be conducted or non-conducted with the third node N3 and control the pull-down power supply terminal VGL to be conducted or non-conducted with the third node N3 in response to a potential of the second node N2. Here, coupling is electrical connection.

For example, the first input circuit 01 controls the pull-down power supply terminal VGL to be conducted with the first node N1 when a potential of the first clock signal is a first potential, and control the pull-up power supply terminal VGH to be conducted with the first node N1 when the potential of the first clock signal is a second potential. When the pull-up power supply terminal VGH is conducted with the first node N1, a pull-up power signal provided by the pull-up power supply terminal VGH is transmitted to the first node N1 through the first input circuit 01. When the pull-down power supply terminal VGL is conducted with the first node N1, a pull-down power signal provided by the pull-down power supply terminal VGL is transmitted to the first node N1 through the first input circuit 01. In this way: the potential of the first node N1 is controlled.

For example, the first input circuit 01 further controls the pull-down power supply terminal VGL to be conducted with the third node N3 when the potential of the second node N2 is the first potential, and control the pull-up power supply terminal VGH to be conducted with the third node N3 when the potential of the second node N2 is the second potential. Similarly, when the pull-up power supply terminal VGH is conducted with the third node N3, the pull-up power signal is transmitted to the third node N3 through the first input circuit 01. When the pull-down power supply terminal VGL is conducted with the third node N3, the pull-down power signal is transmitted to the third node N3 through the first input circuit 01. In this way, the potential of the third node N3 is controlled.

Optionally: the potential of the pull-up power signal is the first potential, and the potential of the pull-down power signal is the second potential. In the embodiments of the present disclosure, the first potential is a high potential relative to the second potential. That is, the first potential is higher than the second potential. In addition, for an N-type transistor, the first potential (i.e., high potential) is a valid potential, and the second potential (i.e., low potential) is an invalid potential. For a P-type transistor, the first potential is an invalid potential, and the second potential is a valid potential.

Still referring to FIG. 1, the second input circuit 02 is coupled to the first node N1, the second node N2, the third node N3, the pull-up power supply terminal VGH, the pull-down power supply terminal VGL, an input control terminal CSTV, and the first clock terminal CKV1. The second input circuit 02 is configured to control the pull-up power supply terminal VGH to be conducted or non-conducted with the second node N2 and control the pull-down power supply terminal VGL to be conducted or non-conducted with the second node N2 in response to the potential of the first node N1, the potential of the third node N3, the first clock signal, and an input control signal provided by the input control terminal CSTV.

For example, the second input circuit 02 controls the pull-down power supply terminal VGL to be conducted with the second node N2 when the potential of the first clock signal and a potential of the input control signal are both the first potential, and/or control the pull-down power supply terminal VGL to be conducted with the second node N2 when the potential of the first node N1 and the potential of the third node N3 are both the first potential. In addition, the second input circuit 02 controls the pull-up power supply terminal VGH to be conducted with the second node N2 when the potential of the first node N1 and the potential of the input control signal are both the second potential, and/or control the pull-up power supply terminal VGH to be conducted with the second node N2 when the potential of the first clock signal and the potential of the third node N3 are both the second potential.

When the pull-up power supply terminal VGH is conducted with the second node N2, the pull-up power signal is transmitted to the second node N2 through the second input circuit 02. When the pull-down power supply terminal VGL is conducted with the second node N2, the pull-down power signal is transmitted to the second node N2 through the second input circuit 02. In this way, the potential of the second node N2 is controlled.

Still referring to FIG. 1, the output circuit 03 is coupled to the pull-up power supply terminal VGH, the pull-down power supply terminal VGL, the third node N3, a second clock terminal CKV2, and an output terminal OUT. The output circuit 03 is configured to control the pull-up power supply terminal VGH to be conducted or non-conducted with the output terminal OUT and control the pull-down power supply terminal VGL to be conducted or non-conducted with the output terminal OUT in response to the potential of the third node N3 and a second clock signal provided by the second clock terminal CKV2.

For example, the output circuit 03 controls the pull-up power supply terminal VGH to be conducted with the output terminal OUT when the potential of the third node N3 and a potential of the second clock signal are both the first potential. In addition, the output circuit 03 controls the pull-down power supply terminal VGL to be conducted with the output terminal OUT when the potential of the third node N3 is the second potential and/or the potential of the second clock signal is the first potential.

When the pull-up power supply terminal VGH is conducted with the output terminal OUT, the pull-up power signal is transmitted to the output terminal OUT through the output circuit 03. When the pull-down power supply terminal VGL is conducted with the output terminal OUT, the pull-down power signal is transmitted to the output terminal OUT through the output circuit 03. In this way, the potential of the output terminal OUT is controlled. The output terminal OUT is coupled to a gate signal terminal of a pixel circuit in a display panel to provide a gate drive signal to the gate signal terminal. A transistor coupled to the gate signal terminal in the pixel circuit is reliably turned on or turned off in response to the pull-up power signal and the pull-down power signal transmitted by the output terminal OUT.

Based on the foregoing embodiments, it can be known that the shift register unit described in the embodiments of the present disclosure includes only the input circuits and the output circuit. The pull-up power signal at the high potential and the pull-down power signal at the low potential are reliably transmitted to the output terminal OUT by flexibly setting the first clock signal provided by the first clock terminal CKV1, the second clock signal provided by the second clock terminal CKV2, and the input control signal provided by the input control terminal CSTV. The shift register unit needs to be provided with fewer signal terminals, and the control process is simple.

In summary: the embodiments of the present disclosure provide the shift register unit. In the shift register unit, the first input circuit controls the potential of the first node under control of the first clock signal provided by the first clock terminal and control the potential of the third node under control of the potential of the second node. The second input circuit controls the potential of the second node under control of the first clock signal, the input control signal provided by the input control terminal, the potential of the third node, and the potential of the first node. The output circuit transmits the pull-up power signal at the high potential or the pull-down power signal at the low potential to the output terminal under control of the third node. In this way, the potential of the output terminal is controlled only by flexibly setting the clock signals provided by the two clock terminals and the input control signal provided by the input control terminal. The control process is simple, and the control flexibility is high.

Figure 2:
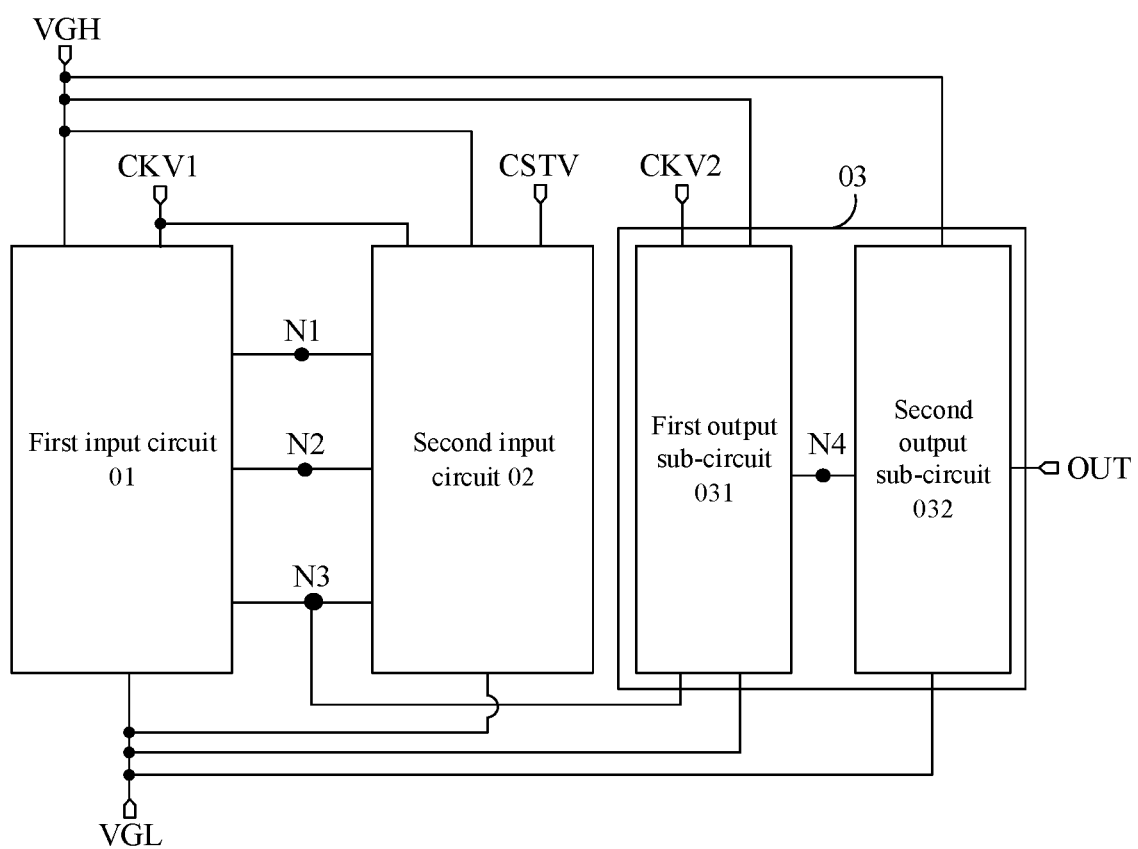
FIG. 2 is a schematic structural diagram of another shift register unit according to some embodiments of the present disclosure.

FIG. 2 is a schematic structural diagram of another shift register unit according to some embodiments of the present disclosure. As shown in FIG. 2, the output circuit 03 includes a first output sub-circuit 031 and a second output sub-circuit 032.

The first output sub-circuit 031 is coupled to the second clock terminal CKV2, the third node N3, the pull-up power supply terminal VGH, the pull-down power supply terminal VGL, and a fourth node N4. The first output sub-circuit 031 is configured to control the pull-up power supply terminal VGH to be conducted or non-conducted with the fourth node N4 and control the pull-down power supply terminal VGL to be conducted or non-conducted with the fourth node N4 in response to the second clock signal and the potential of the third node N3.

For example, the first output sub-circuit 031 controls the pull-down power supply terminal VGL to be conducted with the fourth node N4 when the potential of the third node N3 and the potential of the second clock signal are both the first potential, and control the pull-up power supply terminal VGH to be conducted with the fourth node N4 when the potential of the third node N3 is the second potential and/or the potential of the second clock signal is the second potential. When the pull-down power supply terminal VGL is conducted with the fourth node N4, the pull-down power signal is transmitted to the fourth node N4 through the first output sub-circuit 031. When the pull-up power supply terminal VGH is conducted with the fourth node N4, the pull-up power signal is transmitted to the fourth node N4 through the first output sub-circuit 031. In this way, the potential of the fourth node N4 is controlled.

The second output sub-circuit 032 is coupled to the fourth node N4, the pull-up power supply terminal VGH, the pull-down power supply terminal VGL, and the output terminal OUT. The second output sub-circuit 032 is configured to control the pull-up power supply terminal VGH to be conducted or non-conducted with the output terminal OUT and control the pull-down power supply terminal VGL to be conducted or non-conducted with the output terminal OUT in response to the potential of the fourth node N4.

For example, the second output sub-circuit 032 controls the pull-down power supply terminal VGL to be conducted with the output terminal OUT when the potential of the fourth node N4 is the first potential, and control the pull-up power supply terminal VGH to be conducted with the output terminal OUT when the potential of the fourth node N4 is the second potential. When the pull-down power supply terminal VGL is conducted with the output terminal OUT, the pull-down power signal is transmitted to the output terminal OUT through the second output sub-circuit 032. When the pull-up power supply terminal VGH is conducted with the output terminal OUT, the pull-up power signal is transmitted to the output terminal OUT through the second output sub-circuit 032. In this way, the potential of the output terminal OUT is controlled.

Figure 3:
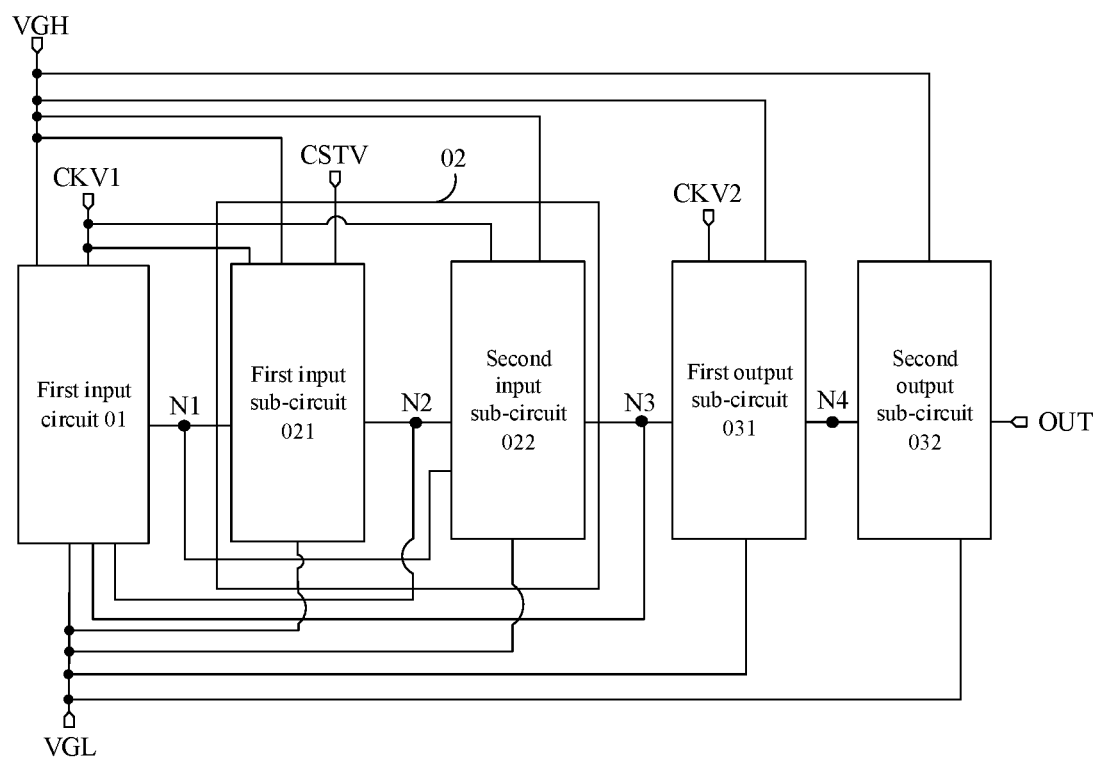
FIG. 3 is a schematic structural diagram of still another shift register unit according to some embodiments of the present disclosure.

FIG. 3 is a schematic structural diagram of still another shift register unit according to some embodiments of the present disclosure. As shown in FIG. 3, the second input circuit 02 includes a first input sub-circuit 021 and a second input sub-circuit 022.

The first input sub-circuit 021 is coupled to the first node N1, the first clock terminal CKV1, the input control terminal CSTV, the pull-up power supply terminal VGH, the pull-down power supply terminal VGL, and the second node N2. The first input sub-circuit 021 is configured to control the pull-up power supply terminal VGH to be conducted or non-conducted with the second node N2 and control the pull-down power supply terminal VGL to be conducted or non-conducted with the second node N2 in response to the potential of the first node N1, the input control signal, and the first clock signal.

For example, the first input sub-circuit 021 controls the pull-down power supply terminal VGL to be conducted with the second node N2 when the potential of the first clock signal and the potential of the input control signal are both the first potential. In addition, the first input sub-circuit 021 controls the pull-up power supply terminal VGH to be conducted with the second node N2 when the potential of the first node N1 and the potential of the input control signal are both the second potential. When the pull-up power supply terminal VGH is conducted with the second node N2, the pull-up power signal is transmitted to the second node N2 through the first input sub-circuit 021. When the pull-down power supply terminal VGL is conducted with the second node N2, the pull-down power signal is transmitted to the second node N2 through the first input sub-circuit 021. In this way: the potential of the second node N2 is controlled.

The second input sub-circuit 022 is coupled to the first clock terminal CKV1, the first node N1, the second node N2, the third node N3, the pull-up power supply terminal VGH, and the pull-down power supply terminal VGL. The second input sub-circuit 022 is configured to control the pull-up power supply terminal VGH to be conducted or non-conducted with the second node N2 and control the pull-down power supply terminal VGL to be conducted or non-conducted with the second node N2 in response to the potential of the first node N1, the potential of the third node N3, and the first clock signal.

For example, the second input sub-circuit 022 controls the pull-down power supply terminal VGL to be conducted with the second node N2 when the potential of the first node N1 and the potential of the third node N3 are both the first potential. In addition, the second input sub-circuit 022 controls the pull-up power supply terminal VGH to be conducted with the second node N2 when the potential of the first clock signal and the potential of the third node N3 are both the second potential. When the pull-up power supply terminal VGH is conducted with the second node N2, the pull-up power signal is transmitted to the second node N2 through the second input sub-circuit 022. When the pull-down power supply terminal VGL is conducted with the second node N2, the pull-down power signal is transmitted to the second node N2 through the second input sub-circuit 022. In this way, the potential of the second node N2 is controlled.

Figure 4:
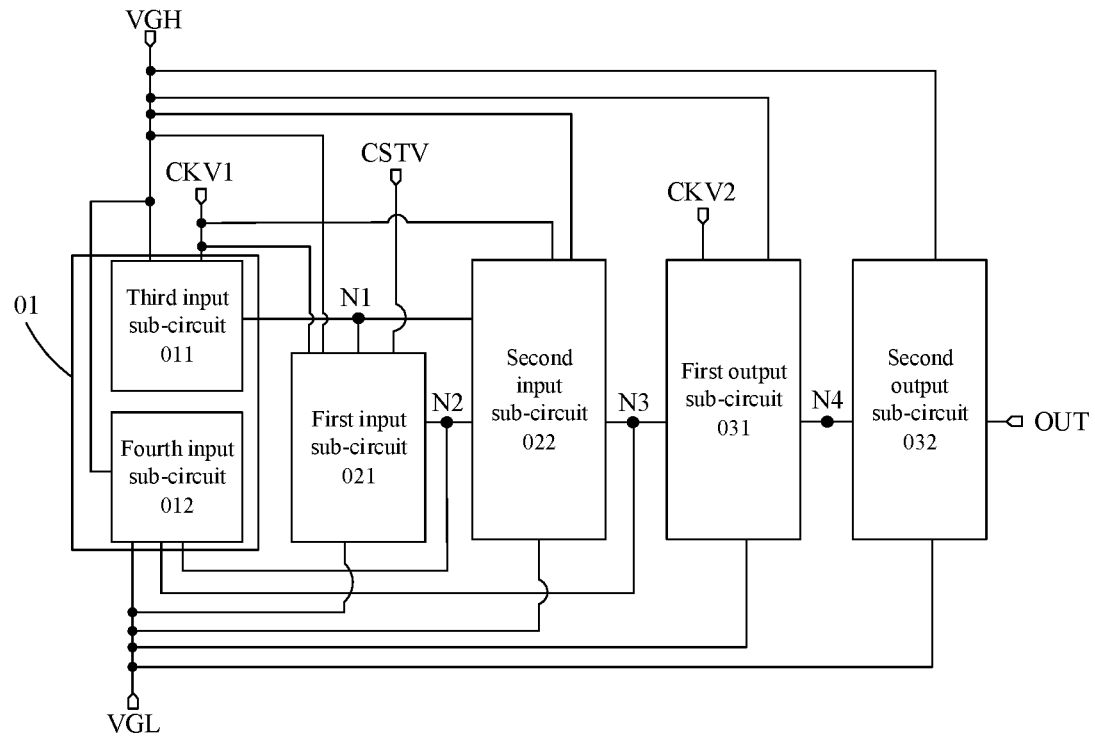
FIG. 4 is a schematic structural diagram of still another shift register unit according to some embodiments of the present disclosure.

FIG. 4 is a schematic structural diagram of still another shift register unit according to some embodiments of the present disclosure. As shown in FIG. 4, the first input circuit 01 includes a third input sub-circuit 011 and a fourth input sub-circuit 012.

The third input sub-circuit 011 is coupled to the first clock terminal CKV1, the pull-up power supply terminal VGH, the pull-down power supply terminal VGL, and the first node N1. The third input sub-circuit 011 is configured to control the pull-up power supply terminal VGH to be conducted or non-conducted with the first node N1 and control the pull-down power supply terminal VGL to be conducted or non-conducted with the first node N1 in response to the first clock signal.

For example, the third input sub-circuit 011 controls the pull-down power supply terminal VGL to be conducted with the first node N1 when the potential of the first clock signal is the first potential, and control the pull-up power supply terminal VGH to be conducted with the first node N1 when the potential of the first clock signal is the second potential. When the pull-down power supply terminal VGL is conducted with the first node N1, the pull-down power signal is transmitted to the first node N1 through the third input sub-circuit 011. When the pull-up power supply terminal VGH is conducted with the first node N1, the pull-up power signal is transmitted to the first node N1 through the third input sub-circuit 011. In this way, the potential of the first node N1 is controlled.

The fourth input sub-circuit 012 is coupled to the second node N2, the pull-up power supply terminal VGH, the pull-down power supply terminal VGL, and the third node N3. The fourth input sub-circuit 012 is configured to control the pull-up power supply terminal VGH to be conducted or non-conducted with the third node N3 and control the pull-down power supply terminal VGL to be conducted or non-conducted with the third node N3 in response to the potential of the second node N2.

For example, the fourth input sub-circuit 012 controls the pull-down power supply terminal VGL to be conducted with the third node N3 when the potential of the second node N2 is the first potential, and control the pull-up power supply terminal VGH to be conducted with the third node N3 when the potential of the second node N2 is the second potential. When the pull-down power supply terminal VGL is conducted with the third node N3, the pull-down power signal is transmitted to the third node N3 through the fourth input sub-circuit 012. When the pull-up power supply terminal VGH is conducted with the third node N3, the pull-up power signal is transmitted to the third node N3 through the fourth input sub-circuit 012. In this way, the potential of the third node N3 is controlled.

Figure 5:
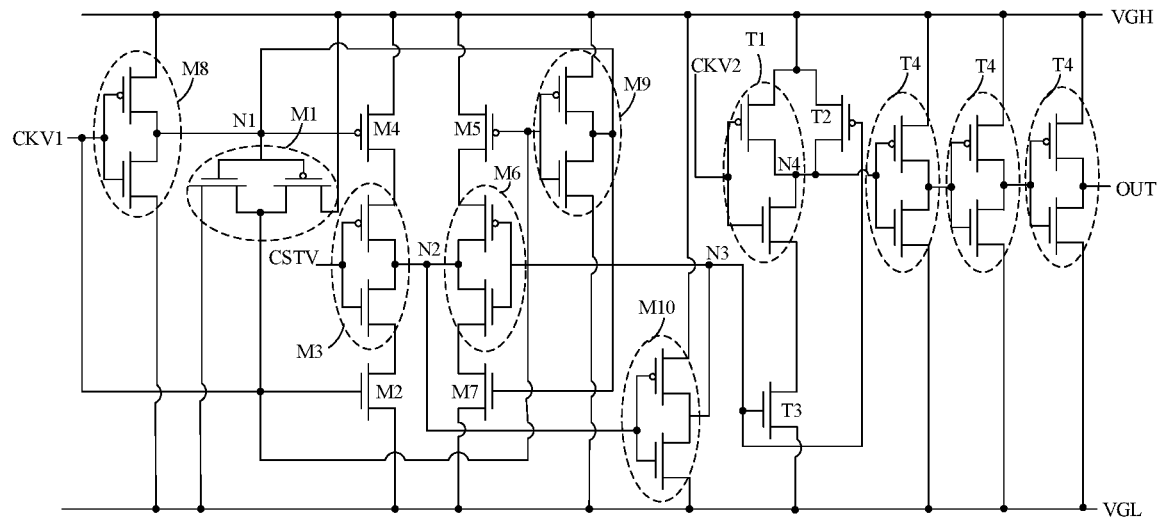
FIG. 5 is a schematic structural diagram of still another shift register unit according to some embodiments of the present disclosure.

FIG. 5 is a schematic structural diagram of still another shift register unit according to some embodiments of the present disclosure. As shown in FIG. 5, the first output sub-circuit 031 includes a first output transistor T1, a second output transistor T2, and a third output transistor T3.

The first output transistor is a complementary metal-oxide-semiconductor (CMOS) transistor. Referring to FIG. 5, it can be known that the CMOS transistor is a complementary MOS integrated circuit consisting of a P-type transistor and an N-type transistor. Therefore, the CMOS transistor has one gate, two first electrodes (which may also be referred to as sources) and one drain. When the gate of the CMOS transistor receives a signal at the high potential, the N-type transistor therein is turned on. At this time, a signal provided by a signal terminal coupled to the first electrode of the N-type transistor in the two first electrodes is transmitted to the second electrode of the CMOS transistor. When the gate of the CMOS transistor receives a signal at the low potential, the P-type transistor therein is turned on. At this time, a signal provided by a signal terminal coupled to the first electrode of the P-type transistor in the two first electrodes is transmitted to the second electrode of the CMOS transistor.

Based on the introduction of the CMOS transistor, referring to FIG. 5, in the embodiments of the present disclosure, a gate of the first output transistor T1 is coupled to the second clock terminal CKV2.

One first electrode of the first output transistor T1 and the first electrode of the second output transistor T2 are both coupled to the pull-up power supply terminal VGH, the other first electrode of the first output transistor T1 is coupled to the second electrode of the third output transistor T3, the second electrode of the first output transistor T1 and the second electrode of the second output transistor T2 are both coupled to the fourth node N4, the gate of the second output transistor T2 and the gate of the third output transistor T3 are both coupled to the third node N3, and the first electrode of the third output transistor T3 is coupled to the pull-down power supply terminal VGL.

Optionally, still referring to FIG. 5, it can be known that the second output sub-circuit 032 includes an odd number of fourth output transistors T4 connected in series between the fourth node N4 and the output terminal OUT.

Each fourth output transistor T4 is a CMOS transistor, and two first electrodes of each fourth output transistor T4 is coupled to the pull-up power supply terminal VGH and the pull-down power supply terminal VGL, respectively.

For example, referring to FIG. 5, the second output sub-circuit 032 includes three fourth output transistors T4 connected in series. A gate of a first one of the fourth output transistors T4 is coupled to the fourth node N4 and a second electrode of the first one of the fourth output transistors T4 is coupled to a gate of a second one of the fourth output transistors T4. A second electrode of the second one of the fourth output transistors T4 is coupled to a gate of a third one of the fourth output transistors T4, and a second electrode of the third one of the fourth output transistors T4 is coupled to the output terminal OUT.

It can be known based on the structure of the second output sub-circuit 032 that the second output sub-circuit 032 inverts the potential of the fourth node N4 and transmits the inverted potential to the output terminal OUT.

Therefore, the odd number of fourth output transistors T4 is replaced by a phase inverter. In addition, because the second output sub-circuit 032 is configured to invert the potential of the fourth node N4 and transmit the inverted potential to the output terminal OUT, the three fourth output transistors T4 included in the second output sub-circuit 032 is also referred to as a three-stage buffer.

Optionally, still referring to FIG. 5, it can be known that the first input sub-circuit 021 includes a first input transistor M1, a second input transistor M2, a third input transistor M3, and a fourth input transistor M4. The first input transistor M1 and the third input transistor M3 are CMOS transistors.

A gate of the first input transistor M1 is coupled to the first node N1, two first electrodes of the first input transistor M1 is coupled to the pull-up power supply terminal VGH and the pull-down power supply terminal VGL respectively, and a second electrode of the first input transistor M1 is coupled to a gate of the second input transistor M2. The gate of the second input transistor M2 is further coupled to the first clock terminal CKV1. That is, the second electrode of the first input transistor M1 and the first clock terminal CKV1 is coupled and both be coupled to the gate of the second input transistor M2.

A first electrode of the second input transistor M2 is coupled to the pull-down power supply terminal VGL and a second electrode of the second input transistor M2 is coupled to one first electrode of the third input transistor M3.

The other first electrode of the third input transistor M3 is coupled to a second electrode of the fourth input transistor M4, a gate of the third input transistor M3 is coupled to the input control terminal CSTV, and a second electrode of the third input transistor M3 is coupled to the second node N2.

A gate of the fourth input transistor M4 is coupled to the first node N1 and a first electrode of the fourth input transistor M4 is coupled to the pull-up power supply terminal VGH.

Optionally, still referring to FIG. 5, it can be known that the second input sub-circuit 022 includes a fifth input transistor M5, a sixth input transistor M6, and a seventh input transistor M7. The sixth input transistor M6 is a CMOS transistor.

A gate of the fifth input transistor M5 is coupled to the first clock terminal CKV1, a first electrode of the fifth input transistor M5 is coupled to the pull-up power supply terminal VGH, and a second electrode of the fifth input transistor M5 is coupled to one first electrode of the sixth input transistor M6. Optionally, referring to FIG. 5, the gate of the fifth input transistor M5 is coupled to a node at which the second electrode of the first input transistor M1 is coupled to the first clock terminal CKV1, so as to be indirectly coupled to the first clock terminal CKV1.

The other first electrode of the sixth input transistor M6 is coupled to a second electrode of the seventh input transistor M7 and a gate of the sixth input transistor M6 is coupled to the third node N3.

A first electrode of the seventh input transistor M7 is coupled to the pull-down power supply terminal VGL and a gate of the seventh input transistor M7 is coupled to the first node N1.

Optionally, still referring to FIG. 5, it can be known that the third input sub-circuit 011 includes an eighth input transistor M8 and a ninth input transistor M9, and the fourth input sub-circuit 012 includes a tenth input transistor M10. The eighth input transistor M8, the ninth input transistor M9, and the tenth input transistor M10 are all CMOS transistors.

A gate of the eighth input transistor M8 and a gate of the ninth input transistor M9 are both coupled to the first clock terminal CKV1, two first electrodes of the eighth input transistor M8 are coupled to the pull-up power supply terminal VGH and the pull-down power supply terminal VGL respectively, so are the two first electrodes of the ninth input transistor M9, and a second electrode of the eighth input transistor M8 and a second electrode of the ninth input transistor M9 are both coupled to the first node N1.

Optionally, referring to FIG. 5, the gate of the ninth input transistor M9 is coupled to the node at which the second electrode of the first input transistor M1 is coupled to the first clock terminal CKV1, so as to be indirectly coupled to the first clock terminal CKV1. The gate of the seventh input transistor M7 is coupled to the second electrode of the ninth input transistor M9, so as to be indirectly coupled to the first node N1.

A gate of the tenth input transistor M10 is coupled to the second node N2, two first electrodes of the tenth input transistor M10 are coupled to the pull-up power supply terminal VGH and the pull-down power supply terminal VGL respectively, and a second electrode of the tenth input transistor M10 is coupled to the third node N3.

It can be known based on the structure shown in FIG. 5 that the shift register unit described in the embodiments of the present disclosure includes 13 P-type transistors (PMOS for short) and 13 N-type transistors (NMOS for short) in total, and 3 control terminals, i.e., the first clock terminal CKV1, the second clock terminal CKV2, and the input control terminal CSTV need to be provided. Certainly, the number of transistors included in the shift register unit is not limited in the embodiments of the present disclosure, and other structures that implement the foregoing functions are alternatively applicable to the solution of the embodiments of the present disclosure.

Optionally, in the embodiments of the present disclosure, a width-to-length ratio of at least one of the fourth output transistors T4 is greater than width-to-length ratios of the transistors in the shift register unit except the at least one fourth output transistor T4. That is, in the transistors shown in FIG. 5, the width-to-length ratio of the at least one of the fourth output transistors T4 is set relatively large. In this way, an overall output capability of the second output sub-circuit 032 is increased such that the transistor (especially the N-type transistor) coupled to the gate signal terminal in the pixel circuit is driven at a high frequency, thereby meeting the requirement of driving a coupled light-emitting element by the pixel circuit.

Optionally, on the premise that the shift register unit includes a plurality of fourth output transistors T4, the width-to-length ratios of the fourth output transistors T4 are the same. Certainly, in some embodiments, the width-to-length ratios of the fourth output transistors T4 are alternatively different.

Optionally, to enable each circuit or sub-circuit to implement the functions described in the foregoing embodiments, it can be known with reference to FIG. 5 that in all the transistors (including CMOS transistors and transistor other than the CMOS transistors) described in the embodiments of the present disclosure, the transistor directly coupled to the pull-up power supply terminal VGH is a P-type transistor, and the transistor directly coupled to the pull-down power supply terminal VGL is an N-type transistor. In addition, in the transistors not directly coupled to the pull-up power supply terminal VGH or the pull-down power supply terminal VGL, in the third input transistor M3, the transistor coupled to the second input transistor M2 is an N-type transistor, and the transistor coupled to the fourth input transistor M4 is a P-type transistor. In the sixth input transistor M6, the transistor coupled to the seventh input transistor M7 is an N-type transistor, and the transistor coupled to the fifth input transistor M5 is a P-type transistor. In the first output transistor T1, the transistor coupled between the fourth node N4 and the third output transistor T3 is an N-type transistor.

The structure composed of the transistors in the first input sub-circuit 021 is referred to as a latch, and this structure combined with the eighth input transistor M8 is referred to as a clock latch. The structure composed of the transistors in the second input sub-circuit 022 and the ninth input transistor M9 is also referred to as a latch, and this structure combined with the tenth input transistor M10 is also referred to as a clock latch. In other words, it can be learned with reference to the foregoing circuit structures and functions that the first input circuit 01 and the second input circuit 02 described in the embodiments of the present disclosure include two clock latches. The two clock latches write a pulse signal with a width of 2H to the third node N3 based on the first clock signal provided by the first clock terminal CKV1 and the input control signal provided by the input control terminal CSTV, that is, form a pulse with a width of 2H at the third node N3, wherein H represents the unit of the pulse width. Then, the first output sub-circuit 031 writes a pulse signal with a width of 1H to the fourth node N4 based on the pulse signal with the width of 2H. In other words, the first output sub-circuit 031 shifts the pulse signal with the width of 2H to the pulse signal with the width of 1H. Finally, after processing by the second output sub-circuit 032, the pulse signal with the width of 1H is formed at the output terminal OUT. A potential of the pulse signal formed at the output terminal OUT is opposite to the potential at the fourth node N4.

In addition, it can also be known with reference to the structure in FIG. 5 that the shift register unit described in the embodiments of the present disclosure only includes a plurality of CMOS transistors, a plurality of P-type transistor, and a plurality of N-type transistor, and does not include any capacitor. The shift register unit described in the embodiments of the present disclosure controls the potential of the output terminal OUT to be the high potential or the low potential through a logic circuit (for example, the clock latch described above), that is, outputs the pulse signal. Therefore, it can be further determined that the control manner of the shift register unit in the embodiments of the present disclosure is simple.

In summary, the embodiments of the present disclosure provide the shift register unit. In the shift register unit, the first input circuit controls the potential of the first node under control of the first clock signal provided by the first clock terminal and control the potential of the third node under control of the potential of the second node. The second input circuit controls the potential of the second node under control of the first clock signal, the input control signal provided by the input control terminal, the potential of the third node, and the potential of the first node. The output circuit transmits the pull-up power signal at the high potential or the pull-down power signal at the low potential to the output terminal under control of the third node. In this way, the potential of the output terminal is controlled only by flexibly setting the clock signals provided by the two clock terminals and the input control signal provided by the input control terminal. The control process is simple, and the control flexibility is high.

Figure 6:
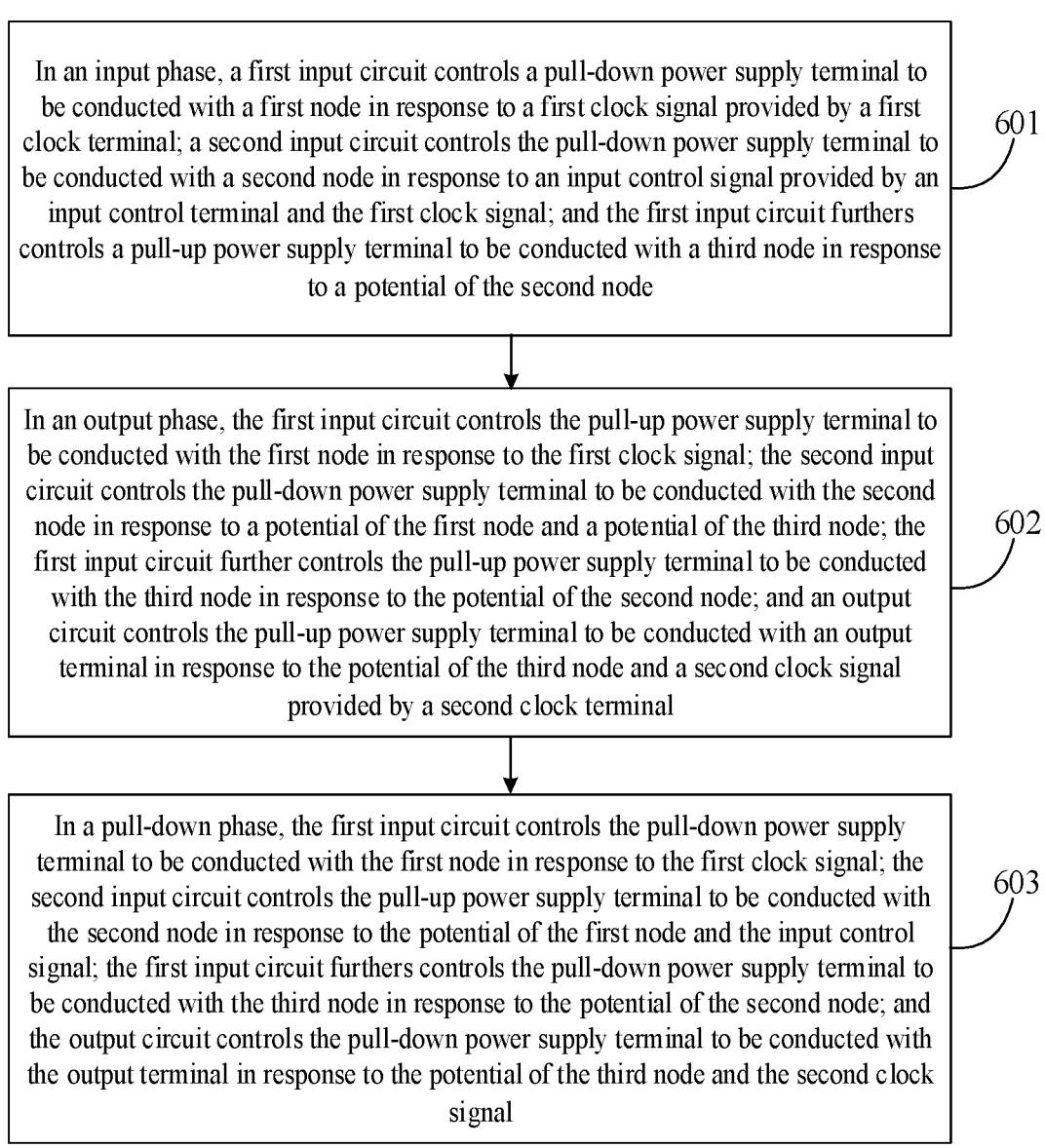
FIG. 6 is a flowchart of a method for driving a shift register unit according to some embodiments of the present disclosure.

FIG. 6 is a flowchart of a method for driving a shift register unit according to some embodiments of the present disclosure. The method is applicable to driving the shift register unit shown in any one of FIG. 1 to FIG. 5. As shown in FIG. 6, the method includes the following steps.

In step 601, in an input phase, a first input circuit controls a pull-down power supply terminal to be conducted with a first node in response to a first clock signal provided by a first clock terminal: a second input circuit controls the pull-down power supply terminal to be conducted with a second node in response to an input control signal provided by an input control terminal and the first clock signal: and the first input circuit furthers controls a pull-up power supply terminal to be conducted with a third node in response to a potential of the second node.

In step 602, in an output phase, the first input circuit controls the pull-up power supply terminal to be conducted with the first node in response to the first clock signal: the second input circuit controls the pull-down power supply terminal to be conducted with the second node in response to a potential of the first node and a potential of the third node: the first input circuit further controls the pull-up power supply terminal to be conducted with the third node in response to the potential of the second node: and an output circuit controls the pull-up power supply terminal to be conducted with an output terminal in response to the potential of the third node and a second clock signal provided by a second clock terminal.

In step 603, in a pull-down phase, the first input circuit controls the pull-down power supply terminal to be conducted with the first node in response to the first clock signal: the second input circuit controls the pull-up power supply terminal to be conducted with the second node in response to the potential of the first node and the input control signal: the first input circuit furthers controls the pull-down power supply terminal to be conducted with the third node in response to the potential of the second node; and the output circuit controls the pull-down power supply terminal to be conducted with the output terminal in response to the potential of the third node and the second clock signal.

Figure 7:
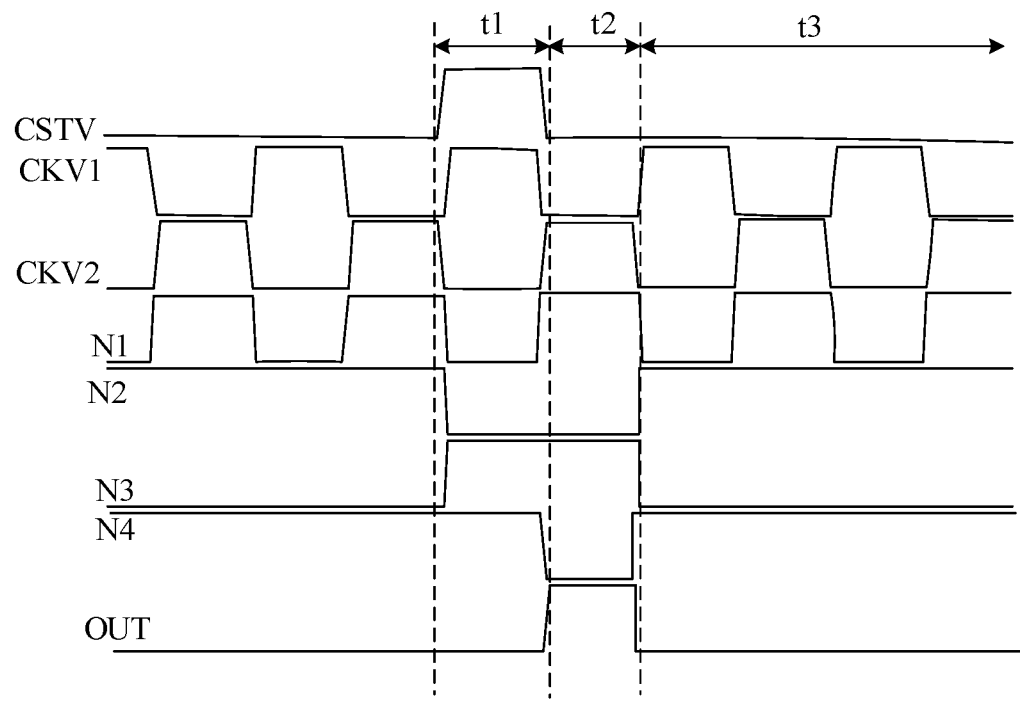
FIG. 7 is a time sequence diagram of signal terminals in a shift register unit according to some embodiments of the present disclosure.

The working principle of the shift register unit provided in the embodiments of the present disclosure is described below by taking the structure shown in FIG. 5 as an example. FIG. 7 is a time sequence diagram of signal terminals and nodes in a shift register unit according to some embodiments of the present disclosure.

As shown in FIG. 7, in an input phase t1, the potential of the first clock signal provided by the first clock terminal CKV1 is the first potential. The N-type transistor in the eighth input transistor M8, the N-type transistor in the ninth input transistor M9, and the second input transistor M2 are all turned on, and the fifth input transistor M5 is turned off. The pull-down power supply terminal VGL is conducted with the first node N1, and the pull-down power signal at the second potential is transmitted to the first node N1 through the N-type transistor in the eighth input transistor M8 and the N-type transistor in the ninth input transistor M9. The fourth input transistor M4 and the P-type transistor in the first input transistor M1 are both turned on, and the seventh input transistor M7 is turned off. The pull-up power signal at the first potential is transmitted to the gate of the second input transistor M2 through the first input transistor M1. The second input transistor M2 is still turned on.

The potential of the input control signal provided by the input control terminal CSTV is the first potential, and the N-type transistor in the third input transistor M3 is turned on. At this time, the pull-down power supply terminal VGL is conducted with the second node N2, and the pull-down power signal at the second potential is transmitted to the second node N2 through the second input transistor M2 and the N-type transistor in the third input transistor M3 that are turned on. The P-type transistor in the tenth input transistor M10 is turned on the pull-up power supply terminal VGH is conducted with the third node N3, and the pull-up power signal at the first potential is transmitted to the third node N3 through the P-type transistor in the tenth input transistor M10. The N-type transistor in the sixth input transistor M6 and the third output transistor T3 are both turned on, and the second output transistor T2 is turned off.

The potential of the second clock signal provided by the second clock terminal CKV2 is the second potential, and the P-type transistor in the first output transistor T1 is turned on. The pull-up power supply terminal VGH is conducted with the fourth node N4, and the pull-up power signal at the first potential is transmitted to the fourth node N4 through the P-type transistor in the first output transistor T1. The N-type transistor in the first one of the fourth output transistors T4 is turned on, and the pull-down power signal at the second potential is transmitted to the gate of the second one of the fourth output transistors T4 through the N-type transistor that is turned on. The P-type transistor in the second one of the fourth output transistors T4 is turned on, and the pull-up power signal at the first potential is transmitted to the gate of the third one of the fourth output transistors T4 through the P-type transistor that is turned on. The N-type transistor in the third one of the fourth output transistors T4 is turned on, and the pull-down power signal at the second potential is transmitted to the output terminal OUT through the N-type transistor that is turned on.

In an output phase t2, the potential of the first clock signal jumps to the second potential, the P-type transistor in the eighth input transistor M8, the P-type transistor in the ninth input transistor M9, and the fifth input transistor M5 are all turned on, and the second input transistor M2 is turned off. The pull-up power supply terminal VGH is conducted with the first node N1, and the pull-up power signal at the first potential is transmitted to the first node N1 through the P-type transistor in the eighth input transistor M8 and the P-type transistor in the ninth input transistor M9. The N-type transistor in the first input transistor M1 and the seventh input transistor M7 are both turned on, and the fourth input transistor M4 is turned off. The pull-down power signal at the second potential is transmitted to the gate of the second input transistor M2 through the N-type transistor in the first input transistor M1. The second input transistor M2 is still turned on.

The potential of the input control signal jumps to the second potential. The P-type transistor in the third input transistor M3 is turned on. Because the potential of the third node N3 is the first potential, the N-type transistor in the sixth input transistor M6, the third output transistor T3, and the second output transistor T2 are all still turned on. Because the seventh input transistor M7 is turned on the pull-down power supply terminal VGL is still conducted with the second node N2. The pull-down power signal at the second potential is transmitted to the second node N2 through the seventh input transistor M7 and the N-type transistor in the sixth input transistor M6 that are turned on. The P-type transistor in the tenth input transistor M10 is still turned on the pull-up power supply terminal VGH is still conducted with the third node N3, and the pull-up power signal at the first potential continues to be transmitted to the third node N3 through the P-type transistor in the tenth input transistor M10. That is, the potential of the third node N3 is still the first potential. The N-type transistor in the sixth input transistor M6 and the third output transistor T3 are both still turned on, and the second output transistor T2 is turned off.

The potential of the second clock signal jumps to the first potential, and the N-type transistor in the first output transistor T1 is turned on. The pull-down power supply terminal VGL is conducted with the fourth node N4, and the pull-down power signal at the second potential is transmitted to the fourth node N4 through the third output transistor T3 and the N-type transistor in the first output transistor T1 that are turned on. The P-type transistor in the first one of the fourth output transistors T4 is turned on, and the pull-up power signal at the first potential is transmitted to the gate of the second one of the fourth output transistors T4 through the P-type transistor that is turned on. The N-type transistor in the second one of the fourth output transistors T4 is turned on, and the pull-down power signal at the second potential is transmitted to the gate of the third one of the fourth output transistors T4 through the N-type transistor that is turned on. The P-type transistor in the third one of the fourth output transistors T4 is turned on, and the pull-up power signal at the first potential is transmitted to the output terminal OUT through the P-type transistor that is turned on.

In a pull-down phase t3, the potential of the first clock signal jumps to the first potential. The N-type transistor in the eighth input transistor M8, the N-type transistor in the ninth input transistor M9, and the second input transistor M2 are all turned on, and the fifth input transistor M5 is turned off. The pull-down power supply terminal VGL is conducted with the first node N1, and the pull-down power signal at the second potential is transmitted to the first node N1 through the N-type transistor in the eighth input transistor M8 and the N-type transistor in the ninth input transistor M9. The fourth input transistor M4 and the P-type transistor in the first input transistor M1 are both turned on, and the seventh input transistor M7 is turned off. The pull-up power signal at the first potential is transmitted to the gate of the second input transistor M2 through the first input transistor M1. The second input transistor M2 is still turned on.

The potential of the input control signal is still the second potential, and the P-type transistor in the third input transistor M3 is turned on. At this time, the pull-up power supply terminal VGH is conducted with the second node N2, and the pull-up power signal at the first potential is transmitted to the second node N2 through the fourth input transistor M4 and the P-type transistor in the third input transistor M3 that are turned on. The N-type transistor in the tenth input transistor M10 is turned on the pull-down power supply terminal VGL is conducted with the third node N3, and the pull-down power signal at the second potential is transmitted to the third node N3 through the N-type transistor in the tenth input transistor M10. The P-type transistor in the sixth input transistor M6 and the second output transistor T2 are both turned on, and the third output transistor T3 is turned off.

The potential of the second clock signal jumps to the second potential, and the P-type transistor in the first output transistor T1 is turned on. The pull-up power supply terminal VGH is conducted with the fourth node N4, and the pull-up power signal at the first potential is transmitted to the fourth node N4 through the P-type transistor in the first output transistor T1 and the second output transistor T2. The N-type transistor in the first one of the fourth output transistors T4 is turned on, and the pull-down power signal at the second potential is transmitted to the gate of the second one of the fourth output transistors T4 through the N-type transistor that is turned on. The P-type transistor in the second one of the fourth output transistors T4 is turned on, and the pull-up power signal at the first potential is transmitted to the gate of the third one of the fourth output transistors T4 through the P-type transistor that is turned on. The N-type transistor in the third one of the fourth output transistors T4 is turned on, and the pull-down power signal at the second potential is transmitted to the output terminal OUT through the N-type transistor that is turned on.

Figure 8:
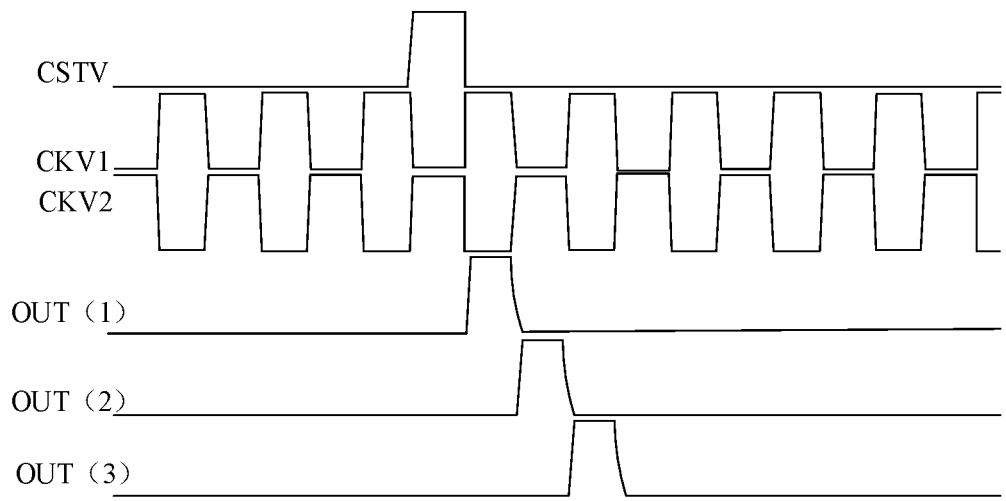
FIG. 8 is a time sequence diagram of signal terminals in another shift register unit according to some embodiments of the present disclosure.

In addition. FIG. 8 further shows a time sequence diagram of signal terminals in three cascaded shift register units. Referring to FIG. 8, it can be known that potentials at the output terminals OUT1, OUT2, and OUT3 of the three shift register units are the first potential in sequence.

In summary: the embodiments of the present disclosure provide the method for driving a shift register unit. According to the method, the first input circuit controls the potential of the first node under control of the first clock signal provided by the first clock terminal and control the potential of the third node under control of the potential of the second node. The second input circuit controls the potential of the second node under control of the first clock signal, the input control signal provided by the input control terminal, the potential of the third node, and the potential of the first node. The output circuit transmits the pull-up power signal at the high potential or the pull-down power signal at the low potential to the output terminal under control of the third node. In this way, the potential of the output terminal is controlled only by flexibly setting the clock signals provided by the two clock terminals and the input control signal provided by the input control terminal. The control process is simple, and the control flexibility is high.

Figure 9:
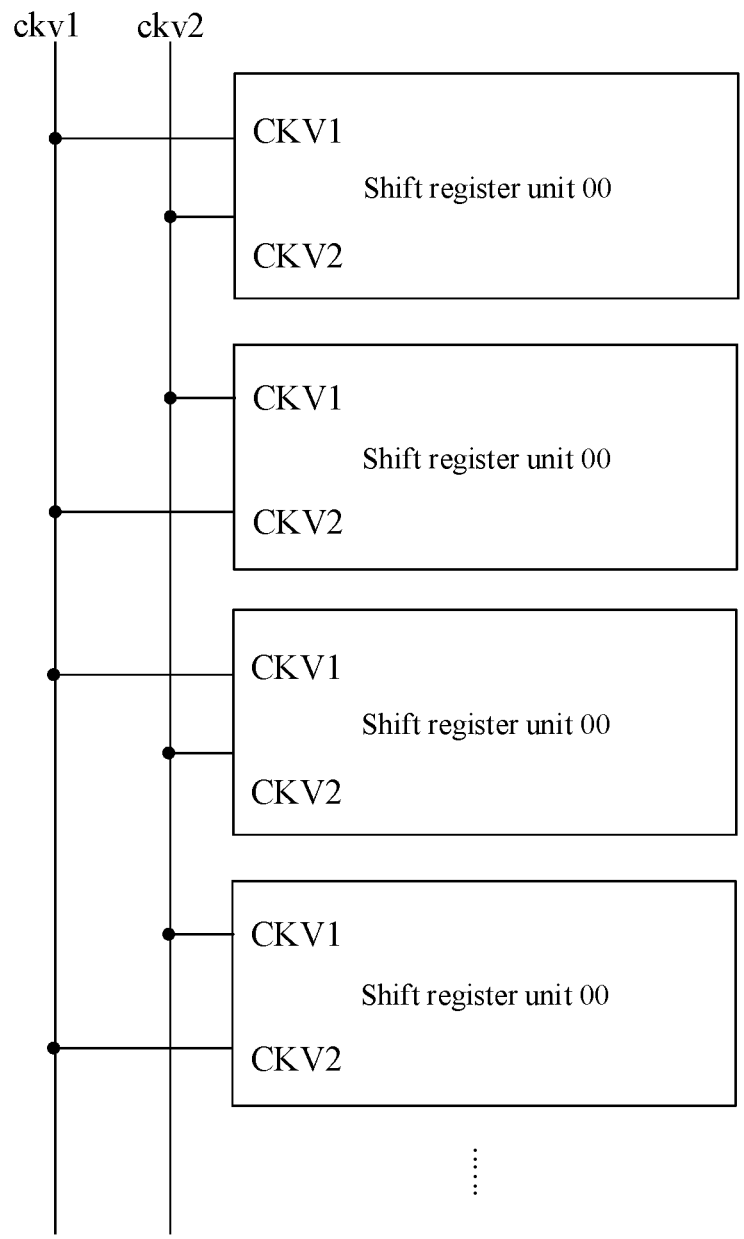
FIG. 9 is a schematic structural diagram of a gate drive circuit according to some embodiments of the present disclosure.

FIG. 9 is a schematic structural diagram of a gate drive circuit according to some embodiments of the present disclosure. As shown in FIG. 9, the gate drive circuit includes at least two cascaded shift register units 00 shown in any one of FIG. 1 to FIG. 5. The gate drive circuit is connected to two clock signal lines in total: a first clock signal line ckv1 and a second clock signal line ckv2.

Referring to FIG. 9, it can be known that the first clock terminal CKV1 of the shift register unit 00 at an odd-numbered stage is coupled to the first clock signal line ckv1 and the second clock terminal CKV2 of the shift register unit 00 at the odd-numbered stage is coupled to the second clock signal line ckv2. The first clock terminal CKV1 of the shift register unit 00 at an even-numbered stage is coupled to the second clock signal line ckv2 and the second clock terminal CKV2 of the shift register unit 00 at the even-numbered stage is coupled to the first clock signal line ckv1. That is, two first clock terminals CKV1 in every two adjacent shift register units 00 are alternately coupled to the first clock signal line ckv1 and the second clock signal line ckv2, and two second clock terminals CKV2 in every two adjacent shift register units 00 are alternately coupled to the first clock signal line ckv1 and the second clock signal line ckv2.

In addition, in the embodiments of the present disclosure, an input control terminal CSTV of the cascaded shift register unit 00 at each stage except the shift register unit 00 at a first stage is coupled to an output terminal OUT of the cascaded shift register unit 00 at a previous stage (not shown in FIG. 9). In this way, cascading is achieved.

Figure 10:
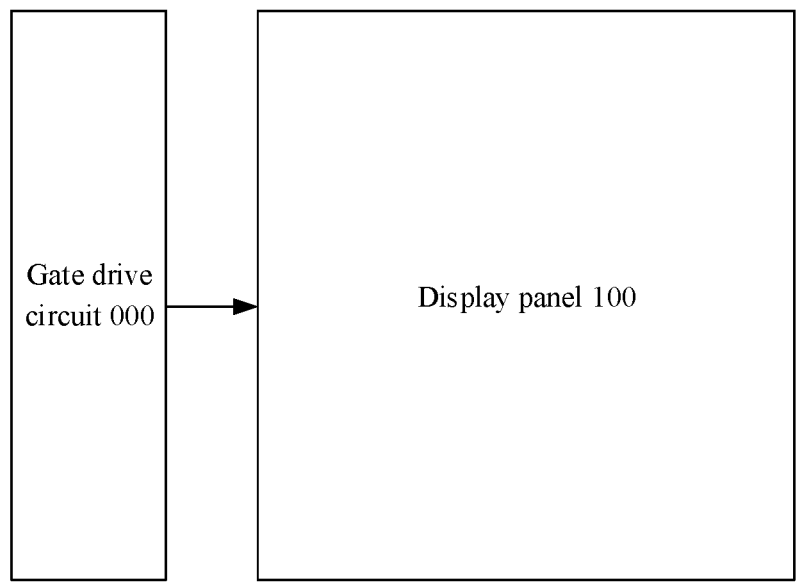
FIG. 10 is a schematic structural diagram of a display device according to some embodiments of the present disclosure.

FIG. 10 shows a display device according to some embodiments of the present disclosure. As shown in FIG. 10, the display device includes a display panel 100 and the gate drive circuit 000 shown in FIG. 9.

The display panel 100 includes a plurality of pixel circuits. The gate drive circuit 000 is coupled to gate signal terminals in the various pixel circuits and is configured to provide gate drive signals to the gate signal terminals.

Optionally, the plurality of pixel circuits in the display panel 100 are arranged in an array: In the gate drive circuit 000, the output terminal of each shift register unit is coupled to the gate signal terminals to which the pixel circuits in a same row are coupled, and the gate signal terminals to which the various shift register units are coupled are disposed in different rows. For example, the gate signal terminals to which the pixel circuits in the same row are coupled are coupled to one gate line, and the gate line is further coupled to the output terminal of one shift register unit.

Optionally, the gate drive circuit 000 is disposed on the display panel 100, that is, the gate drive circuit 000 is integrated with the display panel, to facilitate design of a narrow frame of the display device.

Optionally, in the various transistors in the pixel circuit, the transistor coupled to the gate signal terminal is an N-type indium gallium zinc oxide (IGZO) transistor.

Figure 11:
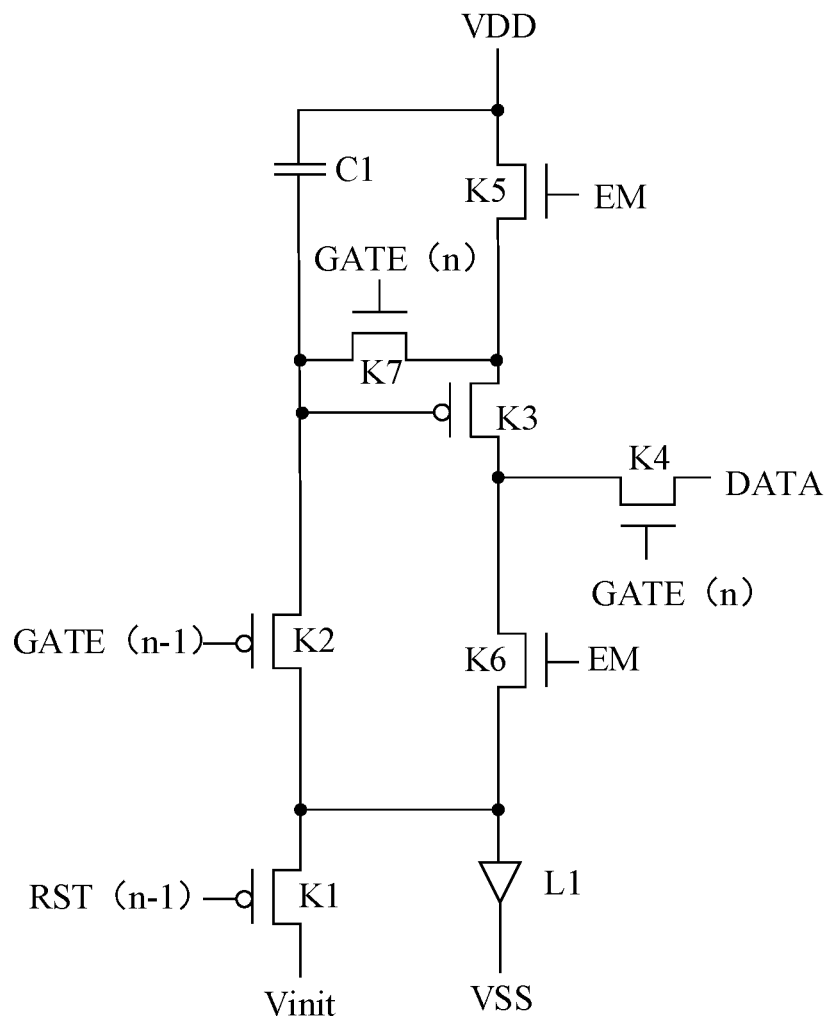
FIG. 11 is a schematic structural diagram of a pixel circuit according to some embodiments of the present disclosure.

For example, FIG. 11 is a schematic structural diagram of a pixel circuit. As shown in FIG. 11, the pixel circuit includes a first switching transistor K1, a second switching transistor K2, a third switching transistor K3, a fourth switching transistor K4, a fifth switching transistor K5, a sixth switching transistor K6, a seventh switching transistor K7, and a storage capacitor C1 in total.

A gate of the first switching transistor K1 is coupled to a reset control terminal RST(n−1), a first electrode of the first switching transistor K1 is coupled to a reset signal terminal Vinit, and a second electrode of the first switching transistor K1 is coupled to an anode of a light-emitting element L1. A cathode of the light-emitting element L1 is coupled to a power supply terminal VSS. The first switching transistor K1 is configured to transmit a reset signal provided by the reset signal terminal Vinit to the anode of the light-emitting element L1 in response to a reset control signal provided by the reset control terminal RST(n−1).

A gate of the second switching transistor K2 is coupled to a switch control terminal GATE(n−1), a first electrode of the second switching transistor K2 is coupled to the second electrode of the first switching transistor K1, and a second electrode of the second switching transistor K2 is coupled to a gate of the third switching transistor K3. The second switching transistor K2 is configured to control the gate of the third switching transistor K3 to be conducted with the second electrode of the first switching transistor K1 in response to a signal provided by the switch control terminal GATE(n−1).

A gate of the fourth switching transistor K4 is coupled to a gate signal terminal GATE(n), a first electrode of the fourth switching transistor K4 is coupled to a data signal terminal DATA, and a second electrode of the fourth switching transistor K4 is coupled to a second electrode of the third switching transistor K3. A gate of the seventh switching transistor K7 is coupled to the gate signal terminal GATE(n), a first electrode of the seventh switching transistor K7 is coupled to a first electrode of the third switching transistor K3, and a second electrode of the seventh switching transistor K7 is coupled to the gate of the third switching transistor K3. The fourth switching transistor K4 is configured to transmit a data signal provided by the data signal terminal DATA to the second electrode of the third switching transistor K3 in response to a gate drive signal provided by the gate signal terminal GATE(n). The seventh switching transistor K7 is configured to control the first electrode of the third switching transistor K3 to be conducted or non-conducted with the gate of the third switching transistor K3 in response to the gate drive signal.

A gate of the fifth switching transistor K5 is coupled to a light-emitting control terminal EM, a first electrode of the fifth switching transistor K5 is coupled to a drive power supply terminal VDD, and a second electrode of the fifth switching transistor K5 is coupled to the first electrode of the third switching transistor K3. A gate of the sixth switching transistor K6 is coupled to the light-emitting control terminal EM, a first electrode of the sixth switching transistor K6 is coupled to the second electrode of the third switching transistor K3, and a second electrode of the sixth switching transistor K6 is coupled to the anode of the light-emitting element L1. The fifth switching transistor K5 is configured to transmit a drive power signal provided by the drive power supply terminal VDD to the first electrode of the third switching transistor K3 in response to a light-emitting control signal provided by the light-emitting control terminal EM. The sixth switching transistor K6 is configured to control the second electrode of the third switching transistor K3 to be conducted or non-conducted with the anode of the light-emitting element L1 in response to the light-emitting control signal.

One terminal of the storage capacitor C1 is coupled to the gate of the third switching transistor K3 and the other terminal of the storage capacitor C1 is coupled to the drive power supply terminal VDD.

Optionally, in the structure shown in FIG. 11, the fourth switching transistor K4 and the seventh switching transistor K7 coupled to the gate signal terminal GATE(n) are both N-type transistors, and are both transistors made of IGZO. The fifth switching transistor K5 and the sixth switching transistor K6 coupled to the light-emitting control terminal EM are both N-type transistors. The other transistors (including the first switching transistor K1, the second switching transistor K2, and the third switching transistor K3) are all P-type transistors.

Figure 12:
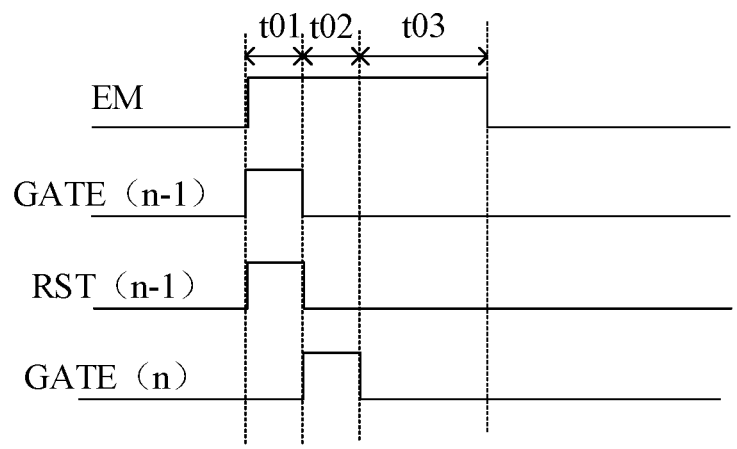
FIG. 12 is a time sequence diagram of signal terminals in a pixel circuit according to some embodiments of the present disclosure.

With reference to the structure of the pixel circuit shown in FIG. 11. FIG. 12 further shows a time sequence diagram of signal terminals in the pixel circuit. Referring to FIG. 12, it can be known that the process of driving the light-emitting element L1 to emit light includes a reset phase t01, a writing phase t02, and a light-emitting phase t03. In FIG. 12, the high potential is a valid potential.

In the reset phase t01, the potential of the signal provided by the switch control terminal GATE(n−1) and the potential of the signal provided by the reset control terminal RST(n−1) are valid potentials. At this time, the first switching transistor K1 and the second switching transistor K2 are turned on, and the reset signal terminal Vinit transmits the reset signal to the gate of the third switching transistor K3 and the anode of the light-emitting element L1. In the writing phase t02, the potential of the gate drive signal provided by the gate signal terminal GATE(n) is a valid potential. At this time, the fourth switching transistor K4 and the seventh switching transistor K7 are turned on, and the data signal terminal DATA transmits the data signal to the gate of the third switching transistor K3. In the light-emitting phase t03, the potential of the light-emitting control signal provided by the light-emitting control terminal EM is a valid potential. The fifth switching transistor K5 and the sixth switching transistor K6 are turned on, and the third switching transistor K3 is still turned on in this phase. The drive power supply terminal VDD transmits the drive power signal to the first electrode of the third switching transistor K3, and the third switching transistor K3 transmits a drive current to the first electrode of the sixth switching transistor K6 based on potentials of the gate and the first electrode of the third switching transistor K3. The sixth switching transistor K6 then transmits the drive current to the light-emitting element L1, and the light-emitting element L1 emits light.

It can be known with reference to the time sequence diagram in FIG. 7 that the time sequence of the output terminal OUT of the shift register unit is consistent with that of the gate signal terminal GATE(n) in FIG. 12.

Due to characteristics of the N-type IGZO transistor, the gate of the N-type IGZO transistor only reliably works in response to a strong drive signal. In the shift register unit known to the inventors, the drive capability of the signal output to the gate signal terminal is weak. Consequently, in the structure shown in FIG. 11, the fourth switching transistor K4 has a weak drive capability and cannot reliably transmit the data signal to the second electrode of the third switching transistor K3, and thus the light-emitting element L1 cannot be reliably driven to emit light. However, the shift register unit provided in the embodiments of the present disclosure has a strong output capability such that the fourth switching transistor K4 reliably transmits the data signal to the second electrode of the third switching transistor K3, thereby ensuring a good light-emitting effect of the light-emitting element L1.

Certainly, FIG. 11 is merely a schematic diagram of an optional pixel circuit with a 7T1C structure (i.e., 7 transistors and 1 capacitor). The structure of the pixel circuit driven by the shift register unit is not limited in the embodiments of the present disclosure. For example, a pixel circuit with a 6T1C structure is alternatively driven.

Optionally, the transistors in the pixel circuit described in the embodiments of the present disclosure is alternatively low temperature polycrystalline oxide (LTPO) transistors.

The display device in the embodiments of the present disclosure is any product or component with a display function, such as an active matrix organic light-emitting diode (AMOLED) display device, an organic light-emitting diode (OLED) display device, or a liquid crystal display device.

It should be understood that the terms such as "first" and "second" in the description of the embodiments of the present disclosure, the claims, and the accompanying drawings are intended to distinguish between similar objects but do not necessarily indicate a specific order or sequence.

It should be understood that the term "and/or" in the description of the embodiments of the present disclosure may indicate three types of relationships. For example, A and/or B may indicate that A exists alone, A and B coexist, or B exists alone. The character "/" generally indicates that the associated objects are in an "or" relationship.

The foregoing descriptions are merely optional embodiments of the present disclosure and are not intended to limit the present disclosure. Any modifications, equivalent replacements, and improvements within the spirit and principles of the present disclosure shall be included within the protection scope of the present disclosure.

What is claimed is:

1. A shift register unit, comprising:
a first input circuit coupled to a first clock terminal, a first node, a second node, a third node, a pull-up power supply terminal, and a pull-down power supply terminal, wherein the first input circuit is configured to control the pull-up power supply terminal to be conducted or non-conducted with the first node and control the pull-down power supply terminal to be conducted or non-conducted with the first node in response to a first clock signal provided by the first clock terminal; and control the pull-up power supply terminal to be conducted or non-conducted with the third node and control the pull-down power supply terminal to be conducted or non-conducted with the third node in response to a potential of the second node;
a second input circuit coupled to the first node, the second node, the third node, the pull-up power supply terminal, the pull-down power supply terminal, an input control terminal, and the first clock terminal, wherein the second input circuit is configured to control the pull-up power supply terminal to be conducted or non-conducted with the second node and control the pull-down power supply terminal to be conducted or non-conducted with the second node in response to a potential of the first node, a potential of the third node, the first clock signal, and an input control signal provided by the input control terminal; and
an output circuit coupled to the pull-up power supply terminal, the pull-down power supply terminal, the third node, a second clock terminal, and an output terminal, wherein the output circuit is configured to control the pull-up power supply terminal to be conducted or non-conducted with the output terminal and control the pull-down power supply terminal to be conducted or non-conducted with the output terminal in response to the potential of the third node and a second clock signal provided by the second clock terminal;
wherein the output circuit comprises a first output sub-circuit and a second output sub-circuit; wherein
the first output sub-circuit is coupled to the second clock terminal, the third node, the pull-up power supply terminal, the pull-down power supply terminal, and a fourth node, and is configured to control the pull-up power supply terminal to be conducted or non-conducted with the fourth node and control the pull-down power supply terminal to be conducted or non-conducted with the fourth node in response to the second clock signal and the potential of the third node; and
the second output sub-circuit is coupled to the fourth node, the pull-up power supply terminal, the pull-down power supply terminal, and the output terminal, and is configured to control the pull-up power supply terminal to be conducted or non-conducted with the output terminal and control the pull-down power supply terminal to be conducted or non-conducted with the output terminal in response to a potential of the fourth node;
wherein the second output sub-circuit comprises an odd number of fourth output transistors connected in series between the fourth node and the output terminal; wherein
each of the fourth output transistors is a CMOS transistor, and two first electrodes of each of the fourth output transistors are coupled to the pull-up power supply terminal and the pull-down power supply terminal, respectively; and
a channel width-to-length ratio of at least one of the fourth output transistors is greater than channel width-to-length ratios of transistors in the shift register unit except the at least one of the fourth output transistors.

2. The shift register unit according to claim 1, wherein the first output sub-circuit comprises a first output transistor, a second output transistor, and a third output transistor, the first output transistor being a complementary metal-oxide-semiconductor (CMOS) transistor; wherein
a gate of the first output transistor is coupled to the second clock terminal, one first electrode of the first output transistor and a first electrode of the second output transistor are both coupled to the pull-up power supply terminal, the other first electrode of the first output transistor is coupled to a second electrode of the third output transistor, a second electrode of the first output transistor and a second electrode of the second output transistor are both coupled to the fourth node, a gate of the second output transistor and a gate of the third output transistor are both coupled to the third node, and a first electrode of the third output transistor is coupled to the pull-down power supply terminal.

3. The shift register unit according to claim 1, wherein the second output sub-circuit comprises three of the fourth output transistors; wherein
a gate of a first one of the fourth output transistors is coupled to the fourth node, and a second electrode of the first one of the fourth output transistors is coupled to a gate of a second one of the fourth output transistors; a second electrode of the second one of the fourth output transistors is coupled to a gate of a third one of the fourth output transistors, and a second electrode of the third one of the fourth output transistors is coupled to the output terminal.

4. The shift register unit according to claim 1, wherein the second input circuit comprises a first input sub-circuit and a second input sub-circuit; wherein the first input sub-circuit is coupled to the first node, the first clock terminal, the input control terminal, the pull-up power supply terminal, the pull-down power supply terminal, and the second node, and is configured to control the pull-up power supply terminal to be conducted or non-conducted with the second node and control the pull-down power supply terminal to be conducted or non-conducted with the second node in response to the potential of the first node, the input control signal, and the first clock signal; and the second input sub-circuit is coupled to the first clock terminal, the first node, the second node, the third node, the pull-up power supply terminal, and the pull-down power supply terminal, and is configured to control the pull-up power supply terminal to be conducted or non-conducted with the second node and control the pull-down power supply terminal to be conducted or non-conducted with the second node in response to the potential of the first node, the potential of the third node, and the first clock signal.

5. The shift register unit according to claim 4, wherein the first input sub-circuit comprises a first input transistor, a second input transistor, a third input transistor, and a fourth input transistor; the first input transistor and the third input transistor being CMOS transistors; wherein a gate of the first input transistor is coupled to the first node, two first electrodes of the first input transistor are coupled to the pull-up power supply terminal and the pull-down power supply terminal respectively, and a second electrode of the first input transistor is coupled to a gate of the second input transistor, and the gate of the second input transistor is further coupled to the first clock terminal;

a first electrode of the second input transistor is coupled to the pull-down power supply terminal and a second electrode of the second input transistor is coupled to one first electrode of the third input transistor;

the other first electrode of the third input transistor is coupled to a second electrode of the fourth input transistor, a gate of the third input transistor is coupled to the input control terminal, and a second electrode of the third input transistor is coupled to the second node; and a gate of the fourth input transistor is coupled to the first node and a first electrode of the fourth input transistor is coupled to the pull-up power supply terminal.

6. The shift register unit according to claim 4, wherein the second input sub-circuit comprises a fifth input transistor, a sixth input transistor, and a seventh input transistor; the sixth input transistor being a CMOS transistor; wherein a gate of the fifth input transistor is coupled to the first clock terminal, a first electrode of the fifth input transistor is coupled to the pull-up power supply terminal, and a second electrode of the fifth input transistor is coupled to one first electrode of the sixth input transistor;

the other first electrode of the sixth input transistor is coupled to a second electrode of the seventh input transistor and a gate of the sixth input transistor is coupled to the third node; and a first electrode of the seventh input transistor is coupled to the pull-down power supply terminal and a gate of the seventh input transistor is coupled to the first node.

7. The shift register unit according to claim 1, wherein the first input circuit comprises a third input sub-circuit and a fourth input sub-circuit; wherein the third input sub-circuit is coupled to the first clock terminal, the pull-up power supply terminal, the pull-down power supply terminal, and the first node, and is configured to control the pull-up power supply terminal to be conducted or non-conducted with the first node and control the pull-down power supply terminal to be conducted or non-conducted with the first node in response to the first clock signal; and the fourth input sub-circuit is coupled to the second node, the pull-up power supply terminal, the pull-down power supply terminal, and the third node, and is configured to control the pull-up power supply terminal to be conducted or non-conducted with the third node and control the pull-down power supply terminal to be conducted or non-conducted with the third node in response to the potential of the second node.

8. The shift register unit according to claim 7, wherein the third input sub-circuit comprises an eighth input transistor and a ninth input transistor; and the fourth input sub-circuit comprises a tenth input transistor; the eighth input transistor, the ninth input transistor, and the tenth input transistor being CMOS transistors; wherein a gate of the eighth input transistor and a gate of the ninth input transistor are both coupled to the first clock terminal, two first electrodes of the eighth input transistor are coupled to the pull-up power supply terminal and the pull-down power supply terminal respectively, and two first electrodes of the ninth input transistor are also coupled to the pull-up power supply terminal and the pull-down power supply terminal respectively; and a second electrode of the eighth input transistor and a second electrode of the ninth input transistor are both coupled to the first node; and a gate of the tenth input transistor is coupled to the second node, two first electrodes of the tenth input transistor are coupled to the pull-up power supply terminal and the pull-down power supply terminal respectively, and a second electrode of the tenth input transistor is coupled to the third node.

9. A method for driving a shift register unit, applicable to driving the shift register unit according to claim 1, the method comprising:

in an input phase, controlling, by a first input circuit, a pull-down power supply terminal to be conducted with a first node in response to a first clock signal provided by a first clock terminal; controlling, by a second input circuit, the pull-down power supply terminal to be conducted with a second node in response to an input control signal provided by an input control terminal and the first clock signal; and controlling further, by the first input circuit, a pull-up power supply terminal to be conducted with a third node in response to a potential of the second node;

in an output phase, controlling, by the first input circuit, the pull-up power supply terminal to be conducted with the first node in response to the first clock signal; controlling, by the second input circuit, the pull-down power supply terminal to be conducted with the second node in response to a potential of the first node and a potential of the third node; controlling further, by the first input circuit, the pull-up power supply terminal to be conducted with the third node in response to the potential of the second node; and controlling, by an output circuit, the pull-up power supply terminal to be conducted with an output terminal in response to the potential of the third node and a second clock signal provided by a second clock terminal; and in a pull-down phase, controlling, by the first input circuit, the pull-down power supply terminal to be conducted with the first node in response to the first clock signal; controlling, by the second input circuit, the pull-up power supply terminal to be conducted with the second node in response to the potential of the first node and the input control signal; controlling further, by the first input circuit, the pull-down power supply terminal to be conducted with the third node in response to the potential of the second node; and controlling, by the output circuit, the pull-down power supply terminal to be conducted with the output terminal in response to the potential of the third node and the second clock signal.

10. A gate drive circuit, comprising at least two cascaded shift register units; wherein each of the at least two cascaded shift register unit comprises:

a first input circuit coupled to a first clock terminal, a first node, a second node, a third node, a pull-up power supply terminal, and a pull-down power supply terminal, wherein the first input circuit is configured to control the pull-up power supply terminal to be conducted or non-conducted with the first node and control the pull-down power supply terminal to be conducted or non-conducted with the first node in response to a first clock signal provided by the first clock terminal; and control the pull-up power supply terminal to be conducted or non-conducted with the third node and control the pull-down power supply terminal to be conducted or non-conducted with the third node in response to a potential of the second node;

a second input circuit coupled to the first node, the second node, the third node, the pull-up power supply terminal, the pull-down power supply terminal, an input control terminal, and the first clock terminal, wherein the second input circuit is configured to control the pull-up power supply terminal to be conducted or non-conducted with the second node and control the pull-down power supply terminal to be conducted or non-conducted with the second node in response to a potential of the first node, a potential of the third node, the first clock signal, and an input control signal provided by the input control terminal; and an output circuit coupled to the pull-up power supply terminal, the pull-down power supply terminal, the third node, a second clock terminal, and an output terminal, wherein the output circuit is configured to control the pull-up power supply terminal to be conducted or non-conducted with the output terminal and control the pull-down power supply terminal to be conducted or non-conducted with the output terminal in response to the potential of the third node and a second clock signal provided by the second clock terminal; and wherein the output circuit comprises a first output sub-circuit and a second output sub-circuit; wherein the first output sub-circuit is coupled to the second clock terminal, the third node, the pull-up power supply terminal, the pull-down power supply terminal, and a fourth node, and is configured to control the pull-up power supply terminal to be conducted or non-conducted with the fourth node and control the pull-down power supply terminal to be conducted or non-conducted with the fourth node in response to the second clock signal and the potential of the third node; and the second output sub-circuit is coupled to the fourth node, the pull-up power supply terminal, the pull-down power supply terminal, and the output terminal, and is configured to control the pull-up power supply terminal to be conducted or non-conducted with the output terminal and control the pull-down power supply terminal to be conducted or non-conducted with the output terminal in response to a potential of the fourth node;

wherein the second output sub-circuit comprises an odd number of fourth output transistors connected in series between the fourth node and the output terminal; wherein each of the fourth output transistors is a CMOS transistor, and two first electrodes of each of the fourth output transistors are coupled to the pull-up power supply terminal and the pull-down power supply terminal, respectively; and a channel width-to-length ratio of at least one of the fourth output transistors is greater than channel width-to-length ratios of transistors in the shift register unit except the at least one of the fourth output transistors;

the first clock terminal of the shift register unit at an odd-numbered stage is coupled to a first clock signal line and the second clock terminal of the shift register unit at the odd-numbered stage is coupled to a second clock signal line; and the first clock terminal of the shift register unit at an even-numbered stage is coupled to the second clock signal line and the second clock terminal of the shift register unit at the even-numbered stage is coupled to the first clock signal line.

11. The gate drive circuit according to claim 10, wherein the first output sub-circuit comprises a first output transistor, a second output transistor, and a third output transistor, the first output transistor being a complementary metal-oxide-semiconductor (CMOS) transistor; wherein a gate of the first output transistor is coupled to the second clock terminal, one first electrode of the first output transistor and a first electrode of the second output transistor are both coupled to the pull-up power supply terminal, the other first electrode of the first output transistor is coupled to a second electrode of the third output transistor, a second electrode of the first output transistor and a second electrode of the second output transistor are both coupled to the fourth node, a gate of the second output transistor and a gate of the third output transistor are both coupled to the third node, and a first electrode of the third output transistor is coupled to the pull-down power supply terminal.

12. The gate drive circuit according to claim 10, wherein the second output sub-circuit comprises three of the fourth output transistors; wherein a gate of a first one of the fourth output transistors is coupled to the fourth node, and a second electrode of the first one of the fourth output transistors is coupled to a gate of a second one of the fourth output transistors; a second electrode of the second one of the fourth output transistors is coupled to a gate of a third one of the fourth output transistors, and a second electrode of the third one of the fourth output transistors is coupled to the output terminal.

13. A display device, comprising a display panel and the gate drive circuit; wherein the display panel comprises a plurality of pixel circuits, and the gate drive circuit comprises at least two cascaded shift register units, wherein each of the at least two cascaded shift register unit comprises:

a first input circuit coupled to a first clock terminal, a first node, a second node, a third node, a pull-up power supply terminal, and a pull-down power supply terminal, wherein the first input circuit is configured to control the pull-up power supply terminal to be conducted or non-conducted with the first node and control the pull-down power supply terminal to be conducted or non-conducted with the first node in response to a first clock signal provided by the first clock terminal; and control the pull-up power supply terminal to be conducted or non-conducted with the third node and control the pull-down power supply terminal to be conducted or non-conducted with the third node in response to a potential of the second node;

a second input circuit coupled to the first node, the second node, the third node, the pull-up power supply terminal, the pull-down power supply terminal, an input control terminal, and the first clock terminal, wherein the second input circuit is configured to control the pull-up power supply terminal to be conducted or non-conducted with the second node and control the pull-down power supply terminal to be conducted or non-conducted with the second node in response to a potential of the first node, a potential of the third node, the first clock signal, and an input control signal provided by the input control terminal; and an output circuit coupled to the pull-up power supply terminal, the pull-down power supply terminal, the third node, a second clock terminal, and an output terminal, wherein the output circuit is configured to control the pull-up power supply terminal to be conducted or non-conducted with the output terminal and control the pull-down power supply terminal to be conducted or non-conducted with the output terminal in response to the potential of the third node and a second clock signal provided by the second clock terminal; and wherein the output circuit comprises a first output sub-circuit and a second output sub-circuit; wherein the first output sub-circuit is coupled to the second clock terminal, the third node, the pull-up power supply terminal, the pull-down power supply terminal, and a fourth node, and is configured to control the pull-up power supply terminal to be conducted or non-conducted with the fourth node and control the pull-down power supply terminal to be conducted or non-conducted with the fourth node in response to the second clock signal and the potential of the third node; and the second output sub-circuit is coupled to the fourth node, the pull-up power supply terminal, the pull-down power supply terminal, and the output terminal, and is configured to control the pull-up power supply terminal to be conducted or non-conducted with the output terminal and control the pull-down power supply terminal to be conducted or non-conducted with the output terminal in response to a potential of the fourth node;

wherein the second output sub-circuit comprises an odd number of fourth output transistors connected in series between the fourth node and the output terminal; wherein each of the fourth output transistors is a CMOS transistor, and two first electrodes of each of the fourth output transistors are coupled to the pull-up power supply terminal and the pull-down power supply terminal, respectively; and a channel width-to-length ratio of at least one of the fourth output transistors is greater than channel width-to-length ratios of transistors in the shift register unit except the at least one of the fourth output transistors;

the first clock terminal of the shift register unit at an odd-numbered stage is coupled to a first clock signal line and the second clock terminal of the shift register unit at the odd-numbered stage is coupled to a second clock signal line;

the first clock terminal of the shift register unit at an even-numbered stage is coupled to the second clock signal line and the second clock terminal of the shift register unit at the even-numbered stage is coupled to the first clock signal line; and the gate drive circuit is coupled to gate signal terminals in the plurality of the pixel circuits, and is configured to provide gate drive signals to the gate signal terminals.

14. The display device according to claim 13, wherein each of the plurality of the pixel circuits comprises a first switching transistor, a second switching transistor, a third switching transistor, a fourth switching transistor, a fifth switching transistor, a sixth switching transistor, a seventh switching transistor, and a storage capacitor; wherein a gate of the first switching transistor is coupled to a reset control terminal, a first electrode of the first switching transistor is coupled to a reset signal terminal, and a second electrode of the first switching transistor is coupled to a first electrode of the second switching transistor, a second electrode of the sixth switching transistor, and an anode of a light-emitting element;

a gate of the second switching transistor is coupled to a switch control terminal and a second electrode of the second switching transistor is coupled to a gate of the third switching transistor;

a gate of the fifth switching transistor and a gate of the sixth switching transistor are both coupled to a light-emitting control terminal, a first electrode of the fifth switching transistor is coupled to a drive power supply terminal, and a second electrode of the fifth switching transistor is coupled to a first electrode of the third switching transistor; and a first electrode of the sixth switching transistor is coupled to a second electrode of the third switching transistor;

a gate of the fourth switching transistor and a gate of the seventh switching transistor are both coupled to the gate signal terminal, a first electrode of the fourth switching transistor is coupled to a data signal terminal, and a second electrode of the fourth switching transistor is coupled to the second electrode of the third switching transistor; and a first electrode of the seventh switching transistor is coupled to the first electrode of the third switching transistor, and a second electrode of the seventh switching transistor is coupled to the gate of the third switching transistor; and one terminal of the storage capacitor is coupled to the gate of the third switching transistor and the other terminal of the storage capacitor is coupled to the drive power supply terminal;

wherein the fourth switching transistor and the seventh switching transistor are N-type indium-gallium-zinc-oxide (IGZO) transistors, and an output terminal of a shift register unit in the gate drive circuit is coupled to the gate of the fourth switching transistor and the gate of the seventh switching transistor.

\* \* \* \* \*